US012713699B2

(12) United States Patent
Chen et al.

(10) Patent No.: US 12,713,699 B2
(45) Date of Patent: Aug. 18, 2026

(54) ARRAY SUBSTRATE, DISPLAY PANEL AND DISPLAY DEVICE

(71) Applicants: Chengdu BOE Display Sci-tech Co., Ltd., Chengdu (CN); BOE TECHNOLOGY GROUP CO., LTD., Beijing (CN)

(72) Inventors: Yinghui Chen, Beijing (CN); Feng Xiao, Beijing (CN); Wei Zhu, Beijing (CN); Xiaojing Qi, Beijing (CN)

(73) Assignees: Chengdu BOE Display Sci-tech Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 510 days.

(21) Appl. No.: 18/284,229

(22) PCT Filed: Jan. 3, 2023

(86) PCT No.: PCT/CN2023/070069

§ 371 (c)(1),
(2) Date: Sep. 26, 2023

(87) PCT Pub. No.: WO2024/145736

PCT Pub. Date: Jul. 11, 2024

(65) Prior Publication Data

US 2024/0429244 A1 Dec. 26, 2024

(51) Int. Cl.

*H10D 86/60* (2025.01)
*G02F 1/1343* (2006.01)

(Continued)

(52) U.S. Cl.

CPC ....... *H10D 86/60* (2025.01); *G02F 1/134309* (2013.01); *G02F 1/136286* (2013.01);

(Continued)

(58) Field of Classification Search

CPC .... H10D 86/60; H10D 86/441; H10D 86/443; H10D 86/421; G02F 1/134309;

(Continued)

(56) References Cited

U.S. PATENT DOCUMENTS

2002/0110962 A1 8/2002 Wada et al.
2006/0098130 A1 5/2006 Lai (Continued)

FOREIGN PATENT DOCUMENTS

CN 104345509 A 2/2015
CN 104698703 A 6/2015

(Continued)

*Primary Examiner* — Thanhha S Pham

(74) *Attorney, Agent, or Firm* — HOUTTEMAN LAW LLC

(57) ABSTRACT

The present disclosure provides an array substrate including a plurality of pixel units, at least one of the pixel units includes a first pixel sub-unit, the first pixel sub-unit includes a first transistor, a second transistor, and a first pixel electrode; the first transistor includes a first active pattern, the second transistor including a second active pattern, the first active pattern includes a first channel region, the second active pattern includes a second channel region; at least one division pattern is arranged between a third electrode and a fourth electrode, and an orthographic projection of the division pattern on a first base substrate is partially overlapped with an orthographic projection of the second channel region on the first base substrate.

20 Claims, 16 Drawing Sheets

(51) Int. Cl.
*G02F 1/1362* (2006.01)
*G02F 1/1368* (2006.01)
*H10D 86/40* (2025.01)

(52) U.S. Cl.
CPC ......... *G02F 1/1368* (2013.01); *H10D 86/441* (2025.01); *H10D 86/421* (2025.01)

(58) Field of Classification Search
CPC ........... G02F 1/13436; G02F 1/136286; G02F 1/1368; H10H 29/10
See application file for complete search history.

(56) References Cited

U.S. PATENT DOCUMENTS

| | | | | |
|---|---|---|---|---|
| 2008/0284929 | A1* | 11/2008 | Kimura | G02F 1/13624 349/48 |
| 2017/0108723 | A1 | 4/2017 | No et al. | |
| 2020/0357343 | A1* | 11/2020 | Cheng | G02F 1/136204 |

FOREIGN PATENT DOCUMENTS

| | | | |
|---|---|---|---|
| CN | 110928084 | A | 3/2020 |
| CN | 111081718 | A | 4/2020 |
| CN | 111090199 | A | 5/2020 |
| CN | 112068371 | A | 12/2020 |
| CN | 113176691 | A | 7/2021 |
| CN | 114002884 | A | 2/2022 |
| JP | 2001119030 | A | 4/2001 |
| JP | 2005017669 | A | 1/2005 |
| KR | 20010083340 | A | 9/2001 |
| KR | 20040040929 | A | 5/2004 |

* cited by examiner

ARRAY SUBSTRATE, DISPLAY PANEL AND DISPLAY DEVICE

TECHNICAL FIELD

The present disclosure relates to the field of display technology, in particular to an array substrate, a display panel and a display device.

BACKGROUND

Liquid Crystal Display (LCD) panels are widely used in large-sized display devices due to their low power consumption. In the related art, since the liquid crystal display panel has a problem of color distortion at a relatively large viewing angle, and thus the liquid crystal display panel usually adopts a multi-domain Vertical Alignment (VA) display mode.

In an eight-domain pixel structure, each complete pixel unit is divided into two pixel sub-units, each pixel sub-unit includes four domains, and by controlling voltages actually loaded on pixel electrodes in the two pixel sub-units, the two pixel sub-units can display at different brightness, that is, each complete pixel unit may has a bright-state area and a dark-state area, with the bright-state area including four domains, and the dark-state area including four domains, so that eight-domain visual display effect can be achieved and the problem of color distortion at the relatively large viewing angle can be effectively improved.

SUMMARY

In a first aspect, an embodiment of the present disclosure provides an array substrate, including: a first base substrate, where a plurality of gate lines, a plurality of data lines and a plurality of discharging lines are arranged on the first base substrate, the gate lines extend along a first direction, the data lines and the discharging lines extend along a second direction, the gate lines and the data lines define a plurality of pixel units, and at least one of the pixel units includes a first pixel sub-unit, the first pixel sub-unit includes a first transistor, a second transistor, and a first pixel electrode;

the first transistor includes: a first gate electrode, a first active pattern, a first electrode and a second electrode, where the first gate electrode is connected with one of the gate lines corresponding thereto, the first electrode is connected with one of the data lines corresponding thereto, and the second electrode is connected with the first pixel electrode;

the second transistor includes: a second gate electrode, a second active pattern, a third electrode and a fourth electrode, where the second gate electrode is connected with the one of the gate lines, the third electrode is connected with one of the discharging lines corresponding thereto, the fourth electrode is connected with the first pixel electrode, and the second active pattern includes a second channel region located between the third electrode and the fourth electrode; and at least one division pattern is arranged between the third electrode and the fourth electrode, and an orthographic projection of the division pattern on the first base substrate is partially overlapped with an orthographic projection of the second channel region on the first base substrate.

In some implementations, the division pattern includes a first portion and a second portion connected to each other, an orthographic projection of the first portion on the first base substrate is located in a region where an orthographic projection of the second channel region on the first base substrate is located, and an orthographic projection of the second portion on the first base substrate does not overlap with the orthographic projection of the second channel region on the first base substrate.

In some implementations, the first active pattern includes a first channel region between the first electrode and the second electrode, the first channel region has a length of L1; and a distance, in a length direction of the second channel region, between any two of the third electrode, the fourth electrode, and the division pattern adjacent to each other in the length direction of the second channel region ranges from $\frac{1}{2}\times L1$ to $3/2\times L1$.

In some implementations, a ratio of a dimension of a width of the division pattern in a length direction of the second channel region to a dimension of a width of the fourth electrode in the length direction of the second channel region ranges from 1 to 2.

In some implementations, the dimension of the width of the division pattern in the length direction of the second channel region ranges from 2.5 μm to 3.5 μm.

In some implementations, two or more division patterns are provided.

In some implementations, a material of the division pattern includes a conductive material.

In some implementations, the division pattern extends in a width direction of the second channel region.

In some implementations, a shape of an orthographic projection of the division pattern on the first base substrate is a rectangle, an ellipse, or an octagon.

In some implementations, the division pattern includes: at least two division sub-patterns arranged at intervals along a width direction of the second channel region, where the interval between any two adjacent division sub-patterns is less than or equal to 1.5 μm.

In some implementations, two or more division patterns are provided, a connection pattern is provided between any two adjacent division patterns, two ends of the connection pattern are respectively connected with the two adjacent division patterns, and an orthographic projection of the connection pattern on the first base substrate does not overlap the orthographic projection of the second channel region on the first base substrate.

In some implementations, an orthographic projection of the second active pattern on the first base substrate covers an orthographic projection of the division pattern on the first base substrate.

In some implementations, a distance between an outer edge of the division pattern and an outer edge, which is on the same side as the outer edge of the division pattern, of the second active pattern ranges from 1 μm to 2 μm.

In some implementations, the first active pattern includes a first channel region between the first electrode and the second electrode, the first channel region has a length of L1 and a width of W1;

the second channel region has a length of L2 and a width of W2; and

W1, L1, W2 and L2 satisfy following conditions: W2/L2 is not greater than W1/L1, and L2 is not less than $3/2\times L1$.

In some implementations, the division pattern is provided in the same layer as the third electrode and the fourth electrode.

In some implementations, the gate lines extend in the first direction, and the data lines and the discharging lines each extend in the second direction;

the third electrode, the fourth electrode and the division pattern each extend along the second direction, and the third electrode, the division pattern and the fourth electrode are arranged along the first direction.

In some implementations, the third electrode and the discharging line are of an unitary structure.

In some implementations, the pixel unit further includes: a second pixel sub-unit, the second pixel sub-unit includes: a third transistor and a second pixel electrode;

the third transistor includes: a third gate electrode, a third active pattern, a fifth electrode and a sixth electrode, where the third gate electrode is connected with one of the gate lines, the fifth electrode is connected with one of the data lines, and the sixth electrode is connected with the second pixel electrode;

the third active pattern includes a third channel region between the fifth electrode and the sixth electrode, the third channel region has a length of L3 and a width of W3;

the first active pattern includes a first channel region between the first electrode and the second electrode, the first channel region having a length of L1 and a width of W1;

where, W3=W1, and L3=L1.

In some implementations, the gate lines extend in the first direction, and the data lines and the discharging lines extend in the second direction;

the first pixel electrode and the second pixel electrode are arranged along the second direction, and the gate line, the first transistor, the second transistor and the third transistor are all located between the first pixel electrode and the second pixel electrode;

the first transistor and the second transistor are both located between the data line and the discharging line.

In some implementations, the first transistor and the third transistor are arranged along the second direction;

the first transistor and the second transistor are arranged along the first direction.

In some implementations, the first electrode and the second electrode each extend along the first direction, and first electrode and the second electrode are arranged along the second direction;

the fifth electrode and the sixth electrode each extend along the first direction, and the fifth electrode and the sixth electrode are arranged along the second direction; and the first electrode and the fifth electrode are the same.

In some implementations, the first active pattern and the third active pattern are connected as an unitary structure;

or, the first active pattern and the third active pattern are arranged at intervals.

In some implementations, the first transistor, the third transistor, and the second transistor are all arranged along the first direction.

In some implementations, the first electrode and the second electrode each extend along the second direction, and the first electrode and the second electrode are arranged along the first direction;

the fifth electrode and the sixth electrode each extend along the second direction, and the fifth electrode and the sixth electrode are arranged along the first direction;

the first electrode and the fifth electrode are the same.

In some implementations, the third electrode, the fourth electrode and the division pattern all extend along the second direction, and the third electrode, the division pattern and the fourth electrode are arranged along the first direction; and the second electrode and the fourth electrode are the same.

In some implementations, the first active pattern, the second active pattern, and the third active pattern are connected as an unitary structure.

In some implementations, the first pixel electrode and the second pixel electrode are both rectangular electrodes;

or, the first pixel electrode and the second pixel electrode each are in a shape of a Chinese character '米'.

In a second aspect, an embodiment of the present disclosure further provides a display panel, including: an array substrate, and an opposite substrate arranged opposite to the array substrate, where the array substrate adopts the array substrate in the first aspect.

In a third aspect, an embodiment of the present disclosure further provides a display device, including: the display panel as provided in the second aspect.

DETAIL DESCRIPTION OF EMBODIMENTS

Figure 1A:
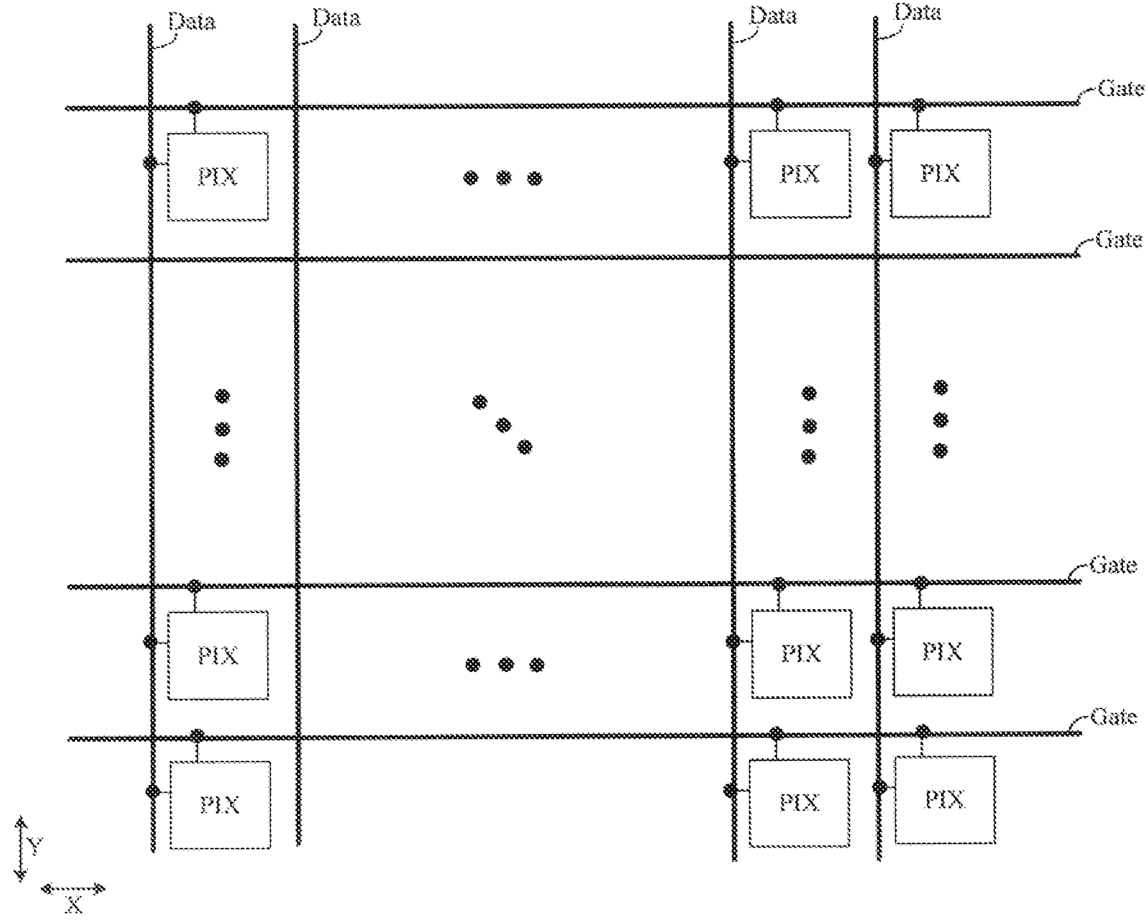
FIG. 1A is a schematic structural diagram of an array substrate according to an embodiment of the present disclosure.

In order to make those skilled in the art better understand the technical solution of the present disclosure, an array substrate, a display panel and a display device provided by the present disclosure will be described in detail below with reference to the accompanying drawings.

Numerous specific details of the present disclosure, such as structures, materials, dimensions, processing methods and techniques of components, are set forth in the following description in order to provide a more thorough understanding of the present disclosure. However, as will be understood by those skilled in the art, the present disclosure may be practiced without these specific details.

The use of "first," "second," and similar terms in the embodiments of the present disclosure is not intended to indicate any order, quantity, or importance, but rather is used to distinguish one element from another. Similarly, the word "including/including" or "includes/includes", and the like, means that the element or item preceding the word includes the element or item listed after the word and its equivalent, but does not exclude other elements or items. The terms "coupled/connected" or "couples/connects," and the like, are not restricted to physical or mechanical couplings, but may include electrical couplings, whether direct or indirect.

The transistors used in the embodiments of the present disclosure may be thin film transistors or field effect transistors or other devices having the same characteristics. In the embodiments of the present disclosure, coupling modes of a drain and a source of each transistor may be interchanged, and thus, the drain and the source of each transistor in the embodiments of the present disclosure are not different. Here, only in order to distinguish two electrodes of the transistor except for a control electrode (i.e., a gate electrode) thereof, one of the two electrodes is referred to as the drain, and the other of the two electrodes is referred to as the source. In the following description, one of the source and the drain of each transistor is referred to as a first electrode, a third electrode, or a fifth electrode, and the other of the source and the drain of the same transistor is referred to as a second electrode, a fourth electrode, or a sixth electrode.

The transistor in the present disclosure further includes an active pattern, where the active pattern at least includes a channel region and source-drain contact regions; the source-drain contact regions are regions which are in contact with the source and the drain of the transistor, and the channel region is a region in the active pattern, which is limited between the source and the drain and can conduct electricity during the transistor being in a conducting state (controlled by a gate voltage); a length of the channel region is approximately equal to a distance between the source and the drain, and a width of the channel region is determined by a shape of the channel region; generally, the width of the channel region is approximately equal to a quotient of an area of the channel region and the length of the channel region. Certainly, the active pattern may include other regions besides the channel region and the source-drain contact regions.

Since the shape of the channel region may be irregular, a length (width) direction of the channel region is not a fixed direction. For example, the channel region may be a crescent channel region, where length directions of the channel region at different positions are different, and width directions of the channel region are approximately corresponding directions of moving along crescent arcs of the channel region. Specific definitions of the length direction and the width direction of the channel region are conventional in the art, and will not be described in detail herein.

The fact that a structure A is located on a side of a structure B away from the first base substrate in the embodiments of the present disclosure means that: there is an overlapping area between orthographic projections of the structures A and B on the substrate, and a distance between a part of the structure A, with the orthographic projection on the substrate being within the overlapping area, and the substrate is greater than a distance between a part of the structure B, with the orthographic projection on the substrate being within the overlapping area, and the substrate. In terms of manufacturing process, a process for manufacturing a material thin film for forming the structure A may be performed after a process for manufacturing a material thin film for forming the structure B.

Two structures being provided in a same layer described in the embodiments of the present disclosure means that the two structures are formed by patterning a same material thin film layer; that is, the two structures can be formed simultaneously by patterning a thin film layer of a same material.

The term "about" or "approximately" as used in the embodiments of the present disclosure includes the stated value and refers to a particular value which may have a deviation, within an acceptable range, as determined by one of ordinary skill in the art taking into account an error of measurement discussed and an error related to the measurement of a particular quantity (i.e., limitations of a measurement system). For example, the term "about" may mean that a difference from the stated value is within one or more standard deviations, or within ±30%, ±20%, ±10%, ±5%.

In the expression of a range from M to N in the embodiments of the present disclosure, a range including the two endpoints of M and N is defined.

Figure 1B:
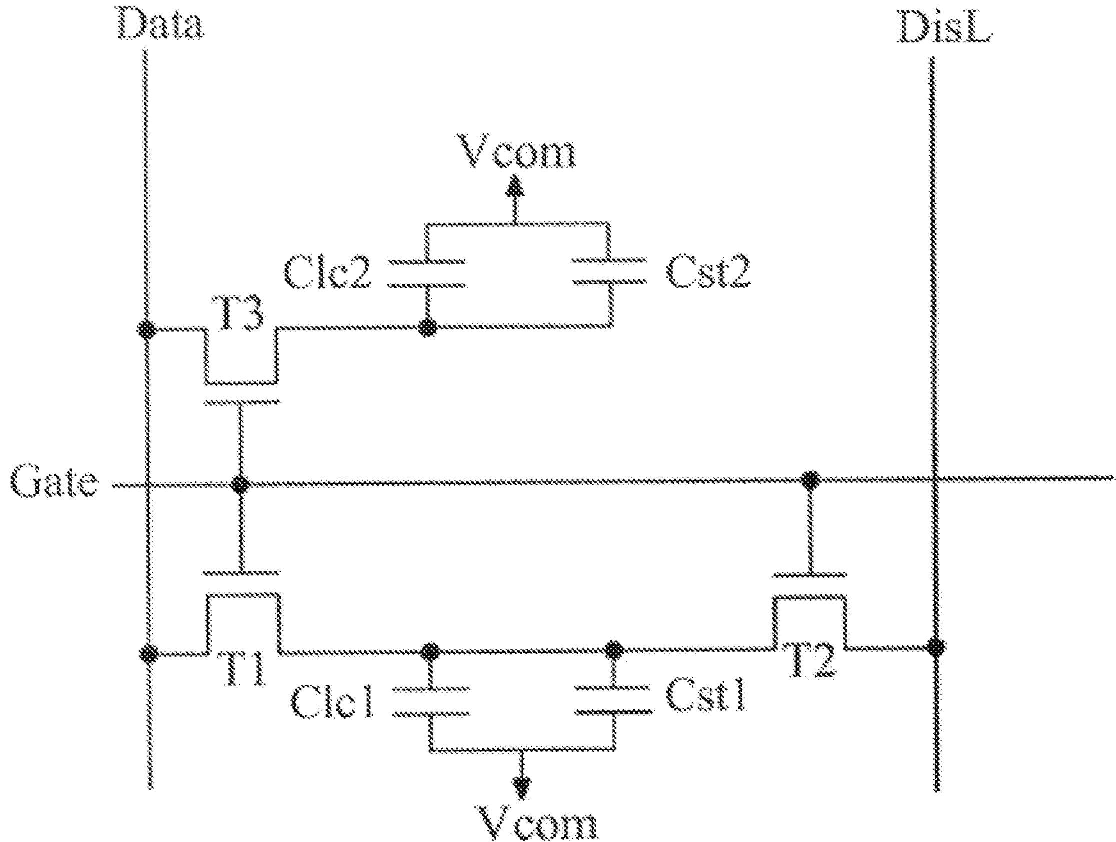
FIG. 1B is a schematic diagram of a circuit structure of a pixel unit according to an embodiment of the present disclosure.

FIG. 1A is a schematic structural diagram of an array substrate according to an embodiment of the present disclosure, and FIG. 1B is a schematic structural diagram of a circuit structure of a pixel unit in an embodiment of the present disclosure. As shown in FIGS. 1A and 1B, the array substrate includes a first base substrate, and a plurality of gate lines Gate, a plurality of data lines Data, and a plurality of discharging lines DisL provided on the first base substrate, the gate lines Gate extend along a first direction X, the data lines Data extend along a second direction Y, the gate lines Gate and the data lines Data define a plurality of pixel units PIX, each of the pixel units PIX in the present disclosure is designed as a multi-domain pixel unit based on a voltage discharging technology, and specifically includes two pixel sub-units including a first pixel sub-unit and a second pixel sub-unit. The first pixel sub-unit includes: a first transistor T1, a second transistor T2, and a first pixel electrode; the second pixel sub-unit includes: a third transistor T3 and a second pixel electrode. The first transistor T1 is connected to the data line Data and the first pixel electrode, and may be configured to charge the first pixel electrode; the second transistor T2 is connected to the discharging line DisL and the first pixel electrode, and is configured to discharge the first pixel electrode; the third transistor T3 is connected to the second pixel electrode and is configured to charge the second pixel electrode. A first liquid crystal capacitor Clc1 and a second liquid crystal capacitor Clc2 may be respectively formed between the first pixel electrode, the second pixel electrode and a common electrode.

In response to that the gate line Gate provides an active level signal, the first transistor T1, the second transistor T2, and the third transistor T3 are all turned on, the third transistor T3 charges the second pixel electrode, the first transistor T1 charges the first pixel electrode, and the second transistor T2 discharges the first pixel electrode. In response to that the gate line Gate is switched from providing the active level signal to providing a non-active level signal, the first transistor T1, the second transistor T2 and the third transistor T3 are all turned off, and in this case, a data voltage actually loaded on the second pixel electrode is greater than a data voltage actually loaded on the first pixel electrode, where a magnitude of the data voltage actually loaded on the first pixel electrode is related to a ratio of a charging rate of the first transistor T1 to a discharging rate of the second transistor T2, and the charging rate of the first transistor T1 and the discharging rate of the second transistor T2 are related to a width-to-length ratio of a channel and a carrier mobility thereof.

For convenience of description, the width and the length of the channel of the first transistor T1 are respectively denoted as W1 and L1, the width and the length of the channel of the second transistor T2 are respectively denoted as W2 and L2, and W1/L1>W2/L2. In practical applications, under a condition that the carrier mobility of the first transistor T1 is equal to that of the second transistor T2, in a case where a ratio of W1/L1 to W2/L2 ranges from 3 to 4, an excellent display effect can be achieved.

In a-Si (amorphous silicon) type transistor products, because the electron mobility of a-Si is relatively low, the width-to-length ratio of the channel of the transistor is generally designed to be relatively large (generally equal to or greater than 3) in order to ensure the charging rate. As an example, the ratio of W1/L1 to W2/L2 is designed to range from 3 to 4, L1 is designed to range from 4 μm to 5.5 μm, W1 is designed to be more than or equal to 15 μm, L2 is designed to be equal to L1, and W2 is designed to range from 4 μm to 5 μm. Since the fluctuation of process (e.g., a feature size CD, a alignment deviation Overlay, a surface topography feature of the channel, and the like, where the feature size CD and the alignment deviation Overlay will affect the width-to-length ratio of the channel, and the surface topography feature of the channel will affect the carrier mobility) for the channel region has a relatively large correlation with the length of the channel, L2 is designed to be equal to L1, so that fluctuations of processes for the channel region of the first transistor T1 and the channel region of the second transistor T2 can be kept consistent or substantially consistent, and the ratio of the charging rate (related to the width-to-length ratio of the channel and the carrier mobility) of the first transistor T1 actually manufactured to the discharging rate of the second transistor T2 actually manufactured can be well ensured to be within the designed range.

In an oxide transistor product, since the electron mobility of an oxide semiconductor is relatively high, the width-to-length ratio of the channel of the transistor is generally designed to be relatively small (generally less than or equal to 2.5) in order to reduce off-state leakage current. As an example, the ratio of W1/L1 to W2/L2 is designed to range from 3 to 4, L1 is designed to range from 3.5 μm to 5 μm, W1 is designed to range from 7 μm to 10 μm, L2 is designed to be equal to L1, and W2 is designed to range from 1.75 μm to 3.33 μm. Although such design ensures that L1 is equal to L2, W2 is designed to be too small, which is hard to be met by the current exposure process. In addition, at present, since a tolerance of fluctuation of the process for the channel region is within a range from +0.8 μm to 1.4 μm, the fluctuation of the process may have a relatively large influence on the width-to-length ratio of the channel of the second transistor T2 actually manufactured, and the width-to-length ratio of the channel of the second transistor T2 may fluctuate significantly, so that it is difficult to control the ratio of the width-to-length ratio of the channel of the first transistor T1 to the width-to-length ratio of the channel of the second transistor T2 to be within the designed range.

In view of above, a new design is proposed for oxide type transistor products. Specifically, L2 is increased on the basis of the aforementioned design, and a designed value of W2 may be increased accordingly, so as to overcome the problem that the aforementioned design has a challenge to the precision of the exposure machine, and the width-to-length ratio of the channel of the second transistor T2 fluctuates significantly due to the W2 being too small. As a specific example, the ratio of W1/L1 to W2/L2 is designed to range from 3 to 4, L1 is designed to range from 3.5 μm to 5 μm, W2 is designed to from 7 μm to 10 μm, L2 is designed to be about 2 times L1 (e.g., 7 μm to 10 μm), and W1 is designed to be about ½ of W2 (e.g., 3.5 μm to 5 μm).

However, in the actual manufacturing process, since L2 is not equal to L1 and a difference between L2 and L1 is relatively large, the fluctuation of process for the channel region of the second transistor T2 are not equal, the ratio of the width-length ratio of the channel of the first transistor T1 actually manufactured to the width-length ratio of the channel of the second transistor T2 actually manufactured is difficult to be controlled, and meanwhile, the surface topography feature of the channel of the first transistor T1 is obviously different from the surface topography feature of the channel of the second transistor T2, so that the carrier mobility of the first transistor T1 is different from the carrier mobility of the second transistor T2. Therefore, it can be seen that, it is difficult to precisely control the ratio of the charging rate of the first transistor T1 to the discharging rate of the second transistor T2.

In order to effectively improve the problem that influence inequality, in fluctuation of process, caused by a difference between the lengths of the channels of the first transistor T1 and the second transistor T2, causes difficulty in controlling the ratio of the charging rate of the first transistor T1 to the discharging rate of the second transistor T2, the present disclosure provides a corresponding solution.

Figure 2:
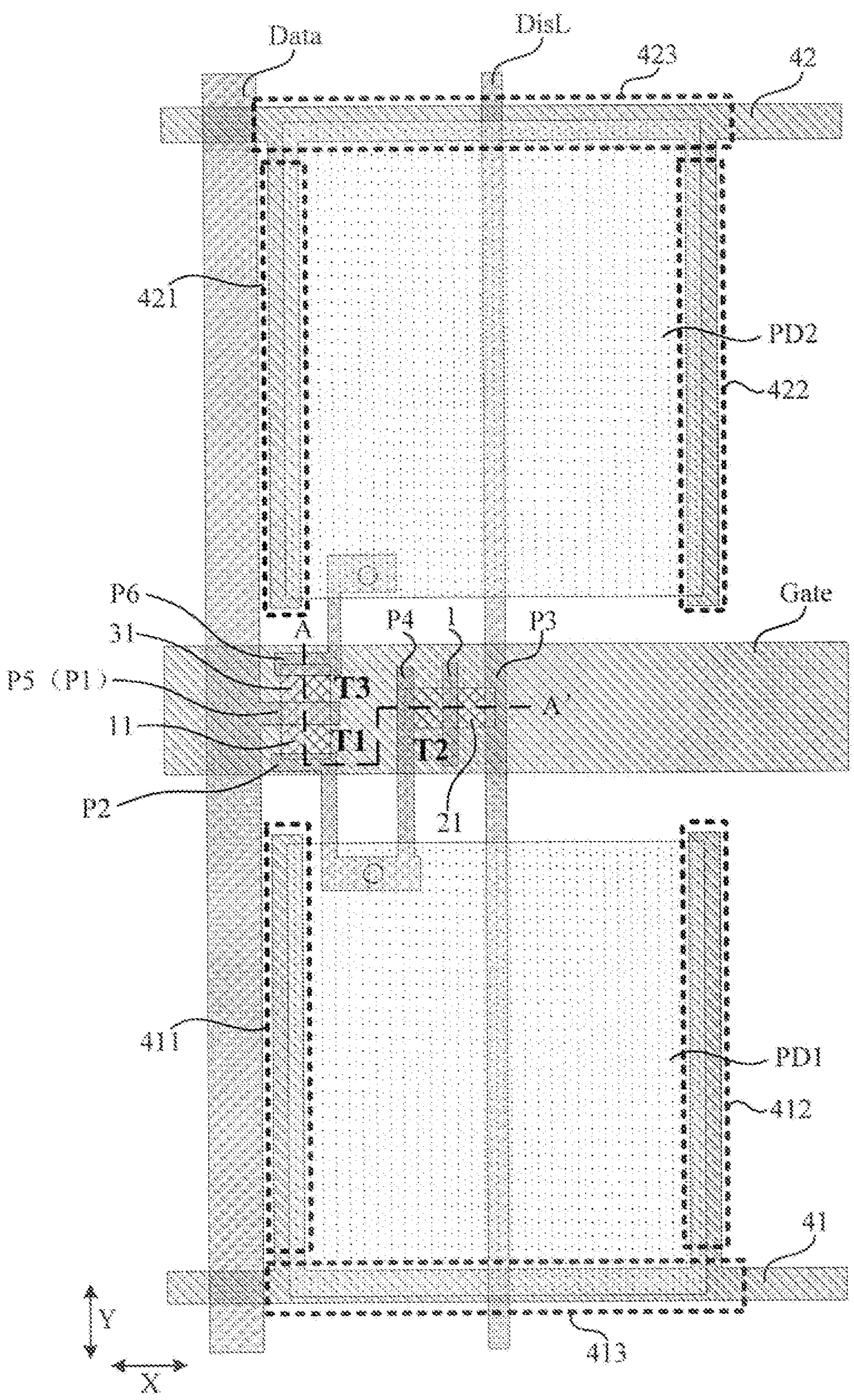
FIG. 2 is a schematic top view of a pixel unit according to an embodiment of the present disclosure.
Figure 3A:
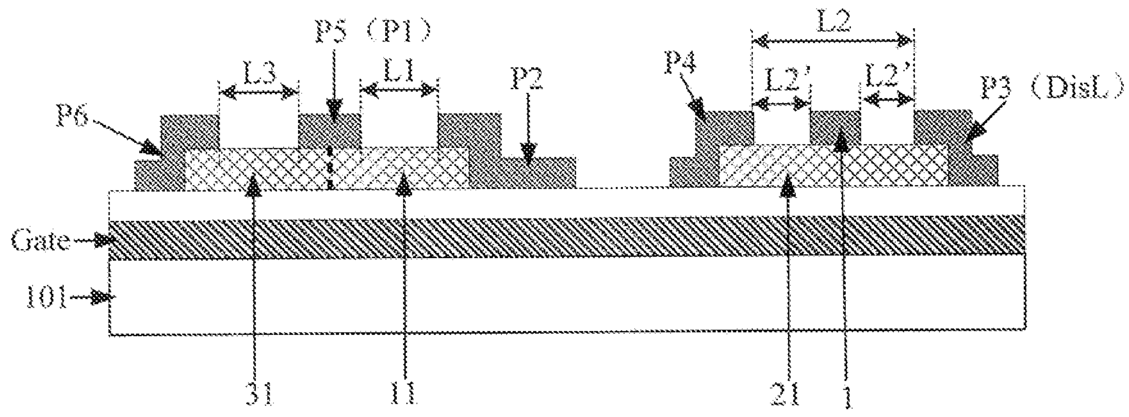
FIGS. 3A and 3B are schematic cross-sectional views of a structure of FIG. 2 taken along a line A-A'.
Figure 3B:
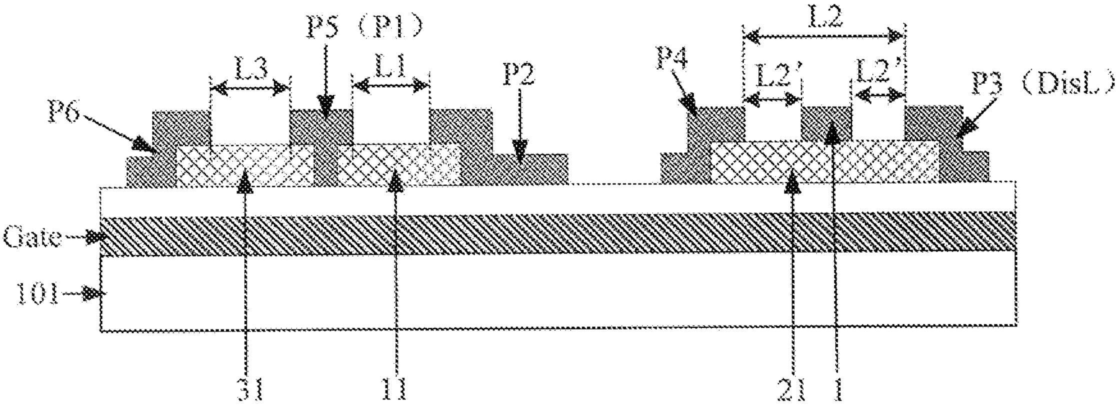

FIG. 2 is a schematic top view of a pixel unit according to an embodiment of the present disclosure. FIGS. 3A and 3B are schematic cross-sectional views of a structure of FIG. 2 taken along a line A-A'. As shown in FIGS. 2 to 3B, the pixel unit includes: a first pixel sub-unit, the first pixel sub-unit includes: a first transistor T1, a second transistor T2, and a first pixel electrode PD1. The first transistor T1 includes: a first gate electrode, a first active pattern 11, a first electrode P1 and a second electrode P2, where the first gate electrode is connected with the gate line Gate corresponding thereto, the first electrode P1 is connected with the data line Data corresponding thereto, and the second electrode P2 is connected with the first pixel electrode PD1. The second transistor T2 includes: a second gate electrode, a second active pattern 21, a third electrode P3 and a fourth electrode P4, the second gate electrode is connected with the gate line Gate, the third electrode P3 is connected to the discharging line DisL corresponding thereto, and the fourth electrode P4 is connected to the first pixel electrode PD1.

The first active pattern 11 includes a first channel region between the first electrode P1 and the second electrode P2, and the second active pattern 21 includes a second channel region between the third electrode P3 and the fourth electrode P4.

At least one division pattern 1 is provided between the third electrode P3 and the fourth electrode P4, and an orthographic projection of the division pattern 1 on the first base substrate 101 partially overlaps an orthographic projection of the second channel region on the first base substrate 101.

In the embodiment of the present disclosure, at least one division pattern is provided between the third electrode P3 and the fourth electrode P4, the second channel region may be divided into at least two small-sized channel sub-regions by the division pattern, and a difference between lengths of the channel sub-region and the first channel region is smaller than a difference between lengths of the second channel region and the first channel region, so that the difference between the influence of the fluctuation of process on the first channel region and the influence of the fluctuation of process on each channel sub-region in the second channel region can be effectively reduced during the actual manufacturing process, which is beneficial to accurately controlling the width-to-length ratios of the channels and the carrier mobilities of the first transistor T1 and the second transistor T2 actually manufactured.

In some implementations, the length of the first channel region is L1 and the width of the first channel region is W1; the second active pattern 21 includes a second channel region between the third electrode P3 and the fourth electrode P4, a length of the second channel region is L2, and a width of the second channel region is W2, where W1, L1, W2 and L2 satisfy the following conditions: W2/L2 is not greater than W1/L1, and L2 is not less than 3/2×L1.

In some implementations, the first electrode P1 and the second electrode P2 are located on a side of the first active pattern 11 away from the first base substrate 101, the third electrode P3 and the fourth electrode P4 are located on a side of the second active pattern 21 away from the first base substrate 101, and the division pattern is located on the side of the second active pattern 21 away from the first base substrate 101.

In some implementations, any two of the third electrode P3, the fourth electrode P4 and the division pattern 1, which are adjacent in a length direction of the second channel region have a pitch L2', ranging from ½×L1 to 3/2×L1, therebetween in the length direction of the second channel region.

In some implementations, the division pattern 1 extends in a width direction of the second channel region.

In the embodiment of the present disclosure, at least one division pattern 1 is provided between the third electrode P3 and the fourth electrode P4 on the side of the second active pattern 21 away from the first base substrate 101, the division pattern 1 can divide the second channel region into at least two channel sub-regions arranged at intervals (separated by the division pattern 1) along the length direction of the second channel region, a length L2' of each channel sub-region ranges from ½×L1 to 3/2×L1, and is similar to or equal to the length L1 of the first channel region, so that the influence of the fluctuation of process on the first channel region is the same or substantially the same as the influence of the fluctuation of process on each channel sub-region in the second channel region in the actual manufacturing process, and the width-to-length ratios of the channels and the carrier mobilities of the first transistor T1 and the second transistor T2 actually manufactured can be precisely controlled, thereby enabling a precise control of the ratio of the charging rate of the first transistor T1 to the discharging rate of the second transistor T2.

With continued reference to FIG. 2, in some implementations, the pixel unit further includes: a second pixel sub-unit, where the second pixel sub-unit includes: a third transistor T3 and a second pixel electrode PD2. The third transistor T3 includes: a third gate electrode connected to the gate line Gate, a third active pattern 31, a fifth electrode P5 and a sixth electrode P6, the fifth electrode P5 is connected to the data line Data, and the sixth electrode P6 is connected to the second pixel electrode PD2. The fifth electrode P5 and the sixth electrode P6 are located on a side of the third active pattern 31 away from the first base substrate 101, the third active pattern 31 includes a third channel region located between the fifth electrode P5 and the sixth electrode P6, a length of the third channel region is L3, and a width of the first channel region is W3, where W3=W1 and L3=L1. That is, the first transistor T1 and the third transistor T3 have the same channel width-to-length ratio.

In some implementations, each transistor in the pixel unit is an oxide type transistor.

In some implementations, the gate line Gate extends in the first direction X, and the data line Data and the discharging line DisL extend in the second direction Y; the first pixel electrode PD1 and the second pixel electrode PD2 are arranged along the second direction Y, and the gate line Gate, the first transistor T1, the second transistor T2 and the third transistor T3 are all located between the first pixel electrode PD1 and the second pixel electrode PD2; the first transistor T1 and the second transistor T2 are both located between the data line Data and the discharging line DisL.

In the embodiment of the present disclosure, the first gate electrode, the second gate electrode and the third gate electrode are arranged in a same layer; further alternatively, different portions of the gate line Gate are reused as the first gate electrode, the second gate electrode, and the third gate electrode, respectively. The first active pattern 11, the second active pattern 21, and the third active pattern 31 are provided in a same layer; the first electrode P1, the second electrode P2, the third electrode P3, the fourth electrode P4, the fifth electrode P5, the sixth electrode P6, the data line Data and the discharging line DisL are arranged in a same layer; and the first pixel electrode PD1 and the second pixel electrode PD2 are provided in a same layer.

In the embodiment of the present disclosure, the first pixel electrode PD1 and the second pixel electrode PD2 may be located on a side of the transistor corresponding thereto away from the first base substrate 101, the first pixel electrode PD1 may be electrically connected to the second electrode P2 and the fourth electrode P4 through via holes, and the second pixel electrode PD2 may be electrically connected to the sixth electrode P6 through a via hole.

It should be noted that the length of the second channel region is determined by a size of a space between the third electrode P3 and the fourth electrode P4, and the surface topography feature of the second channel region is also affected by an etching process for the third electrode P3 and the fourth electrode P4. Therefore, in the embodiment of the present disclosure, the manufacturing process of the division pattern 1 may be prior to the manufacturing process of the third electrode P3 and the fourth electrode P4, or the manufacturing process of the division pattern 1 and the manufacturing process of the third electrode P3 and the fourth electrode P4 may be performed simultaneously.

In some implementations, the division pattern 1 is provided in the same layer as the third electrode P3 and the fourth electrode P4. That is, the division pattern 1 may be formed from the same material film as the third electrode P3 and the fourth electrode P4, that is, the manufacturing process of the division pattern 1 and the manufacturing process of the third electrode P3 and the fourth electrode P4 may be performed simultaneously, and in this case, no additional manufacturing process is desired for the division pattern 1, which is advantageous in shortening the production cycle.

It should be noted that, the case where the division pattern 1, the third electrode P3 and the fourth electrode P4 are provided in the same layer is only an alternative implementation in the embodiments of the present disclosure, which does not limit the technical solution of the present disclosure. In the embodiment of the present disclosure, the division pattern 1 may also be made of a material different from a material of the third electrode P3 and the fourth electrode P4, for example, the division pattern 1 is made of a conductive material or an insulating material different from the material of the third electrode P3 and the fourth electrode P4.

As an example, the array substrate includes a first base substrate 101, and a first conductive layer, a semiconductor layer, a second conductive layer, and a pixel electrode layer which are sequentially provided along a direction away from the first base substrate. The first conductive layer includes gate electrodes of the transistors and the gate lines Gate, the semiconductor layer includes active patterns of the transistors, the second conductive layer includes sources and drains of the transistors, the data lines Data and the discharging lines DisL, and the pixel electrode layer includes the pixel electrodes.

Figure 4A:
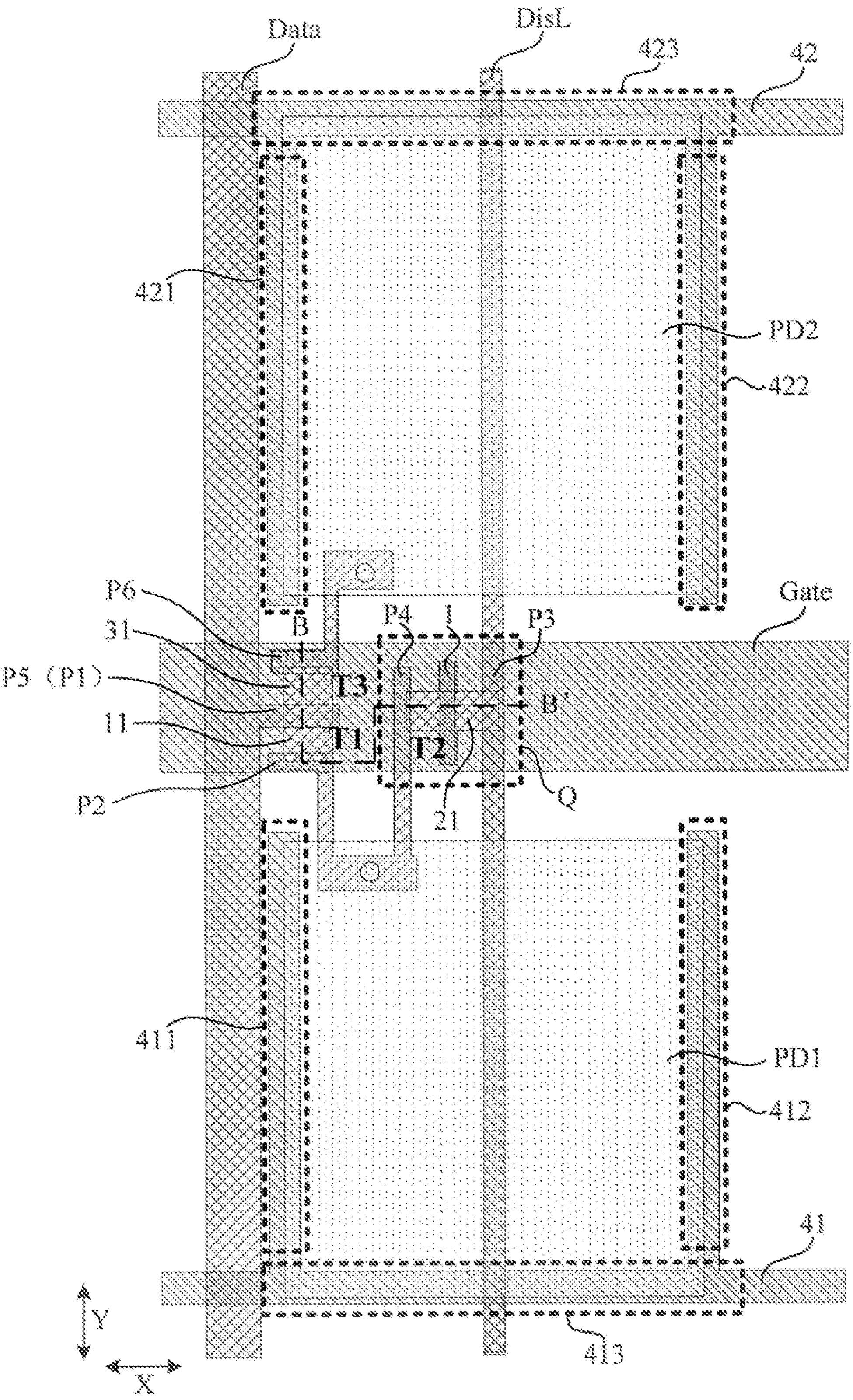
FIG. 4A is a schematic top view of another pixel unit according to an embodiment of the present disclosure.
Figure 4B:
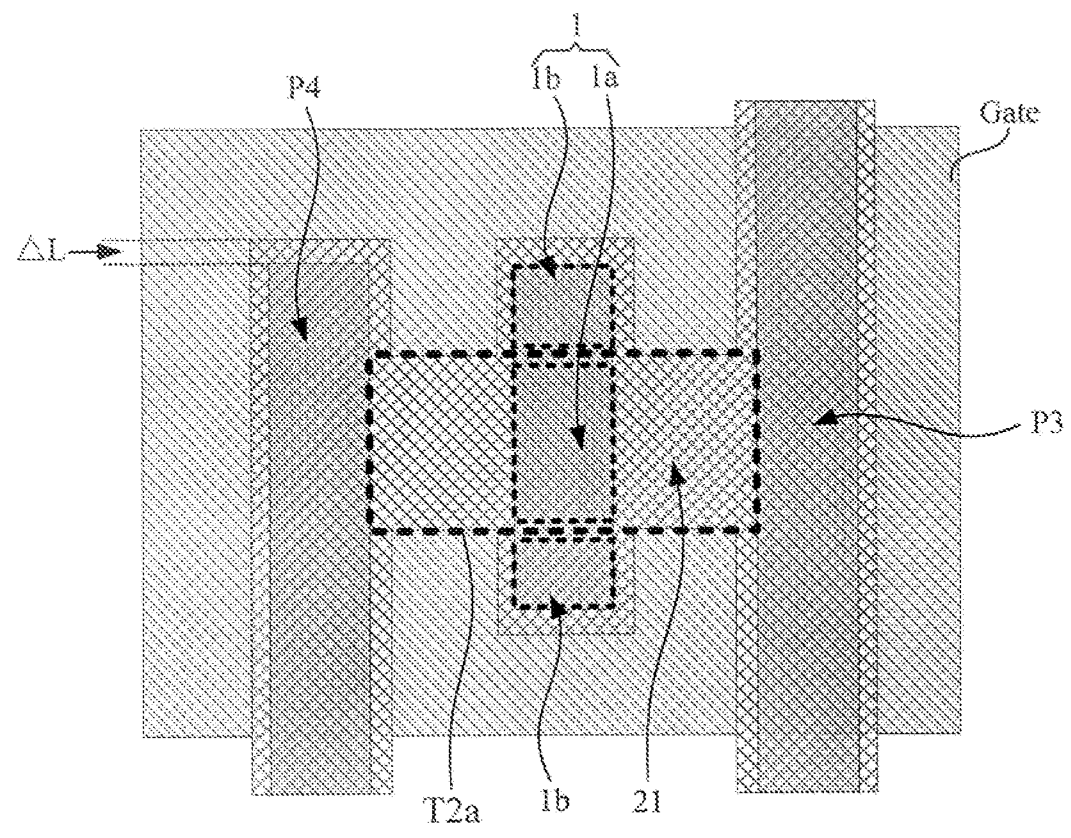
FIG. 4B is an enlarged partial view of an area Q of FIG. 4A.
Figure 5:
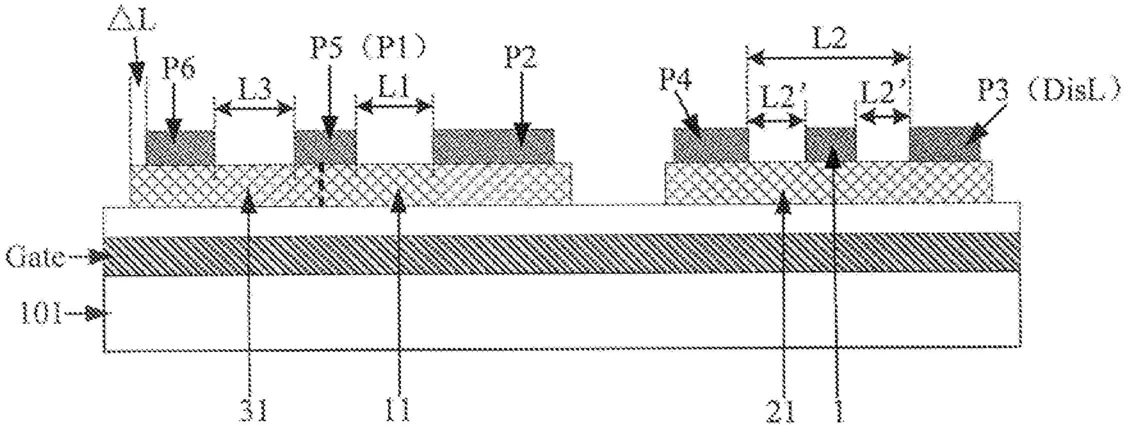
FIG. 5 is a schematic cross-sectional view of a structure of FIG. 4A taken along a line B-B'.

FIG. 4A is a schematic top view of another pixel unit according to an embodiment of the present disclosure. FIG. 4B is a partially enlarged view of a region Q in FIG. 4A. FIG. 5 is a schematic cross-sectional view of a structure of FIG. 4A taken along a line B-B'. As shown in FIGS. 4A to 5, in some implementations, the semiconductor layer and the second conductive layer are formed by patterning through a same Half-tone Mask. The specific process includes the following steps: firstly, sequentially forming an active material film and a source-drain metal material film; then, coating a photoresist on a side, away from the first base substrate 101, of the source-drain metal material film, and performing exposure and development on the photoresist by using a half-tone mask, where portions of the photoresist in regions where structures (such as the first electrode P1, the second electrode P2, the third electrode P3, the fourth electrode P4, the fifth electrode P5, the sixth electrode P6, the data line Data and the discharging line DisL) in the second conductive layer are to be formed subsequently are completely reserved, portions of the photoresist in regions where channel regions (such as the first channel region, the second channel region and the third channel region) in the active pattern are to be formed subsequently are partially reserved (a thickness of the partially reserved portions of the photoresist is relatively thin), and portions of the photoresist in other regions are completely removed; next, respectively etching the source-drain metal material film and the active material film to obtain a pattern of the semiconductor layer and a preliminary pattern of the second conductive layer; then, performing ashing process on the photoresist so as to completely remove portions of the photoresist, except those in regions to be formed therein with division patterns 1, in the first channel region, the third channel region and the second channel region, and partially reserve portions of the photoresist in regions where the structures in the second conductive layer are to be formed; and then, performing a second etching on the preliminary pattern of the second conductive layer to obtain a final pattern of the second conductive layer.

It should be noted that, in a case where no division pattern is designed to be formed in the second channel region, the photoresist in the second channel region is completely removed during the ashing process on the photoresist; in a case where the division pattern is designed to be formed in the second channel region, a portion of the photoresist corresponding to a region where the division pattern in the second channel region is to be formed is reserved; that is, with the division pattern, an area of the photoresist to be completely removed in the ashing process can be reduced, and the precise control on the ashing process is facilitated.

It should be noted that, during manufacturing the semiconductor layer and the second conductive layer by using the half-tone mask, corresponding active material patterns exist below the structures in the second conductive layer. That is, an orthographic projection of the semiconductor layer on the first base substrate 101 may cover an orthographic projection of the second conductive layer on the first base substrate 101. As an example, an orthographic projection of the second active pattern 21 on the first base substrate 101 covers an orthographic projection of the division pattern 1 on the first base substrate 101.

Generally, a distance ΔL between an outer edge of each structure in the second conductive layer and an edge, which is on the same side as the outer side of the structure, of the active material pattern directly below the structure ranges from about 1 μm to about 2 μm.

The semiconductor layer and the second conductive layer are manufactured by using the same half-tone mask, so that the number of mask plates to be used can be effectively reduced, and the production cost is reduced. Certainly, the above case is also only an alternative implementation in the embodiments of the present disclosure, and does not limit the technical solutions of the present disclosure. In the embodiment of the present disclosure, the semiconductor layer and the second conductive layer may also be separately manufactured by using different mask plates.

It should be noted that, in the second transistor manufactured by using the half-tone mask as shown in FIG. 4B, the second active pattern 21 is always present below the division pattern 1, but only a rectangular region T2*a* of the second active pattern 21 between the third electrode P3 and the fourth electrode P4 is capable of forming a conductive region during the second transistor being in an on state (being turned on), and the rectangular region T2*a* is the channel region of the second transistor T2*a*. In this case, the division pattern 1 includes a portion 1*a* located in the rectangular region T2*a* (i.e., a first portion of the division pattern 1 located in the second channel region) and portions 1*b* located in the rectangular region T2*a* (i.e., second portions of the division pattern 1 located outside the second channel region).

With continued reference to FIGS. 2 and 4A, in some implementations, the gate lines Gate extend along the first direction X, the data lines Data and the discharging lines DisL extend along the second direction Y, the third electrode P3, the fourth electrode P4 and the division pattern 1 extend along the second direction Y, the third electrode P3, the division pattern 1 and the fourth electrode P4 are arranged along the first direction X, the length direction of the second channel region is substantially parallel to the first direction X, and the width direction of the second channel region is substantially parallel to the second direction Y.

In some implementations, a portion of the discharging line DisL is reused as the third electrode P3 in the second transistor T2.

FIGS. 6A to 6I are various schematic top views of a second transistor according to an embodiment of the present disclosure. As shown in FIGS. 6A to 6I, at least a portion of the division pattern in the present disclosure is located in the second channel region.

Figure 6A:
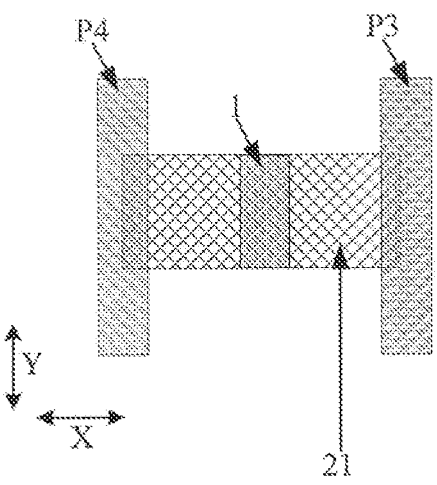
FIGS. 6A to 6I are top views of a second transistor according to an embodiment of the present disclosure.

Referring to FIG. 6A, the division pattern 1 is entirely located in the second channel region, and the division pattern 1 does not include portions located outside the second channel region. In FIG. 6A, a length of the division pattern 1 in the second direction Y is equal to or substantially equal to a width of the second channel region.

Unlike the division pattern of FIG. 6A, which is only located in the second channel region, in some implementations, the division pattern 1 includes a first portion and second portions, an orthographic projection of the first portion on the first base substrate is located in a region where an orthographic projection of the second channel region on the first base substrate is located, and there is no overlap between an orthographic projection of each second portion on the first base substrate and the orthographic projection of the second channel region on the first base substrate. That is, the division pattern 1 includes a portion located inside the second channel region and portions extending outside the second channel region.

Figure 6B:
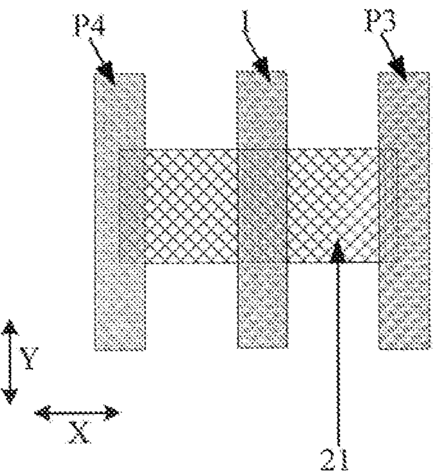
Figure 6C:
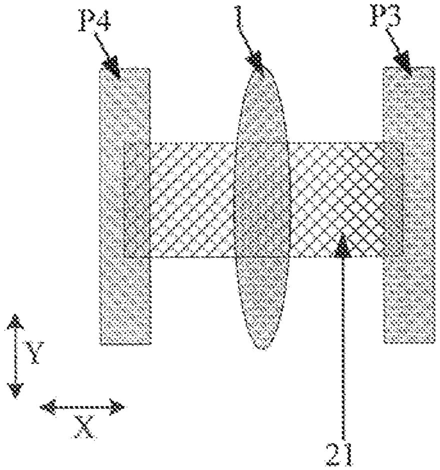
Figure 6D:
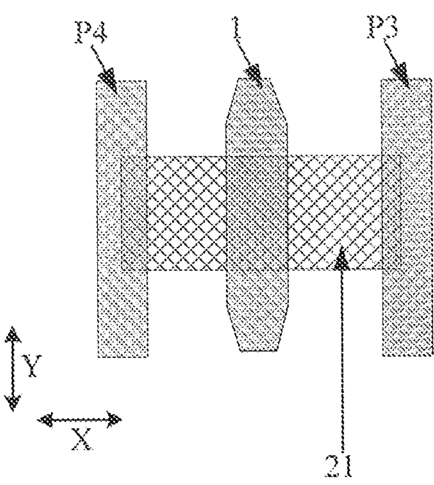

In some implementations, each division pattern 1 is a separate unitary structure. As an example, as shown in FIG. 6B, a shape of the orthographic projection of the division pattern 1 on the first base substrate 101 is rectangular. As another example, as shown in FIG. 6C, the shape of the orthographic projection of the division pattern 1 on the first base substrate 101 is an ellipse. As further another example, as shown in FIG. 6D, the shape of the orthographic projection of the division pattern 1 on the first base substrate 101 is an octagon. Compared to the case shown in FIG. 6B, the cases shown in FIGS. 6C and 6D reduce the probability of erroneous contact between corners of the division pattern 1 and the third electrode P3 or the fourth electrode P4 due to process errors by reducing a size of the division pattern 1 at the corners, and reduce the possibility of short-circuiting defects.

Figure 6E:
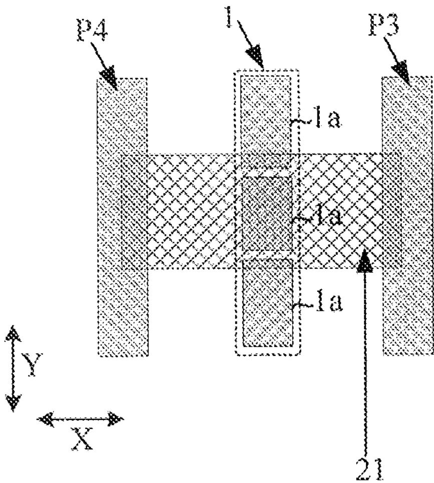

Referring to FIG. 6E, unlike the division patterns 1 shown in FIGS. 6A to 6D, which are separate unitary structures, in some implementations, the division pattern 1 includes: at least two division sub-patterns arranged at intervals in the width direction of the second channel region, where the interval between any two adjacent division sub-patterns is less than or equal to 1.5 μm. In the embodiment of the present disclosure, the division pattern 1 has a structure including at least two division sub-patterns arranged at intervals, so that a parasitic capacitance of the whole division pattern can be effectively reduced. In the embodiment of the present disclosure, in a case where the interval between two adjacent division sub-patterns in the division pattern 1 is too large (generally, larger than 1.5 μm), it cannot play a role of dividing the second channel region.

Figure 6F:
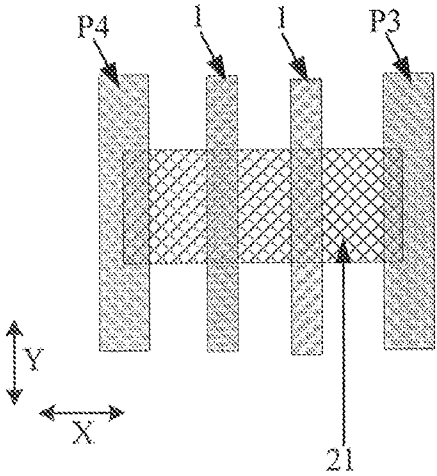

Referring to FIG. 6F, unlike the case where only one division pattern 1 is provided in the second channel region as shown in FIGS. 6A to 6E, in some implementations, the number of division patterns 1 is greater than or equal to 2 (a case where the number of division patterns 1 is equal to 2 is exemplarily shown in FIG. 6E).

Figure 6G:
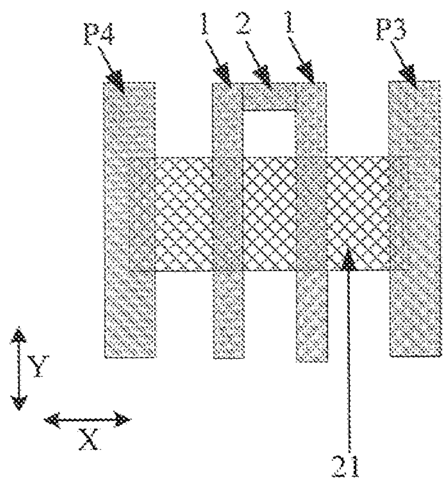
Figure 6H:
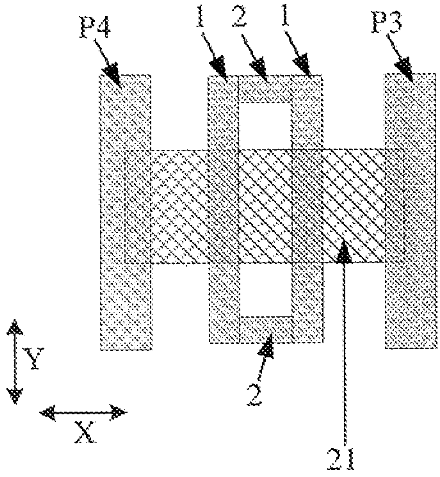

Referring to FIGS. 6G and 6H, in some implementations, the number of division patterns 1 is greater than or equal to 2.

In some implementations, a connection pattern 2 is provided between two adjacent division patterns 1, two ends of the connection pattern 2 are respectively connected to the two adjacent division patterns 1, and an orthographic projection of the connection pattern 2 on the first base substrate is not overlapped with an orthographic projection of the second channel region on the first base substrate.

In some implementations, the connection pattern 2 is provided in the same layer as the division pattern 1, and the connection pattern 2 is located outside the second channel region and connects portions of the adjacent division patterns 1 extending outside the second channel region to form an unitary structure.

Figure 6I:
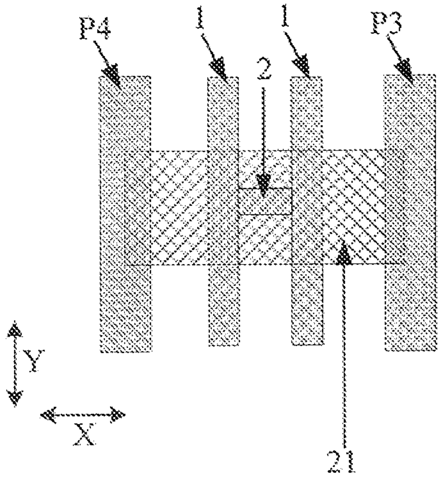

Referring to FIG. 6I, in some implementations, the connection pattern 2 may also be provided in the second channel region.

In the embodiment of the present disclosure, in a case where the division pattern 1 is made of a conductive material, the division pattern 1 may be in a floating state to generate charge accumulation, and since the maximum carrying capacity of each single division pattern 1 for accumulating charges is limited, a phenomenon of discharging generated due to the accumulated charges exceeding the maximum carrying capacity is likely to occur, and the discharging of the division pattern 1 is likely to damage the second active pattern 21. In order to effectively improve the problem, the connection pattern 2 is configured to electrically connect the adjacent division patterns 1, so that the maximum carrying capacity of the division patterns 1 for accumulating charges can be effectively improved, and the probability of discharging of the division patterns 1 can be reduced to a certain extent.

Figure 7:
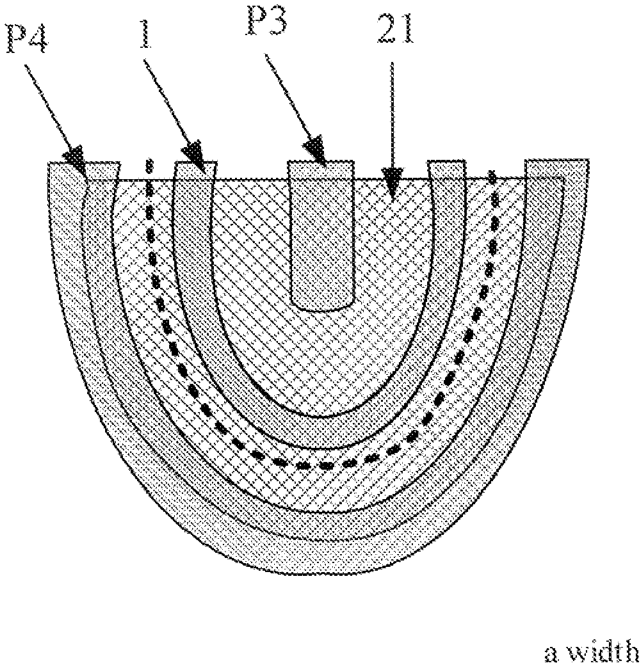
FIG. 7 is a schematic top view of a second transistor according to an embodiment of the present disclosure.

It should be noted that a shape of the second channel region in the embodiment of the present disclosure is not limited to a shape of a Chinese character "一" as shown in FIGS. 6A to 6I. FIG. 7 is another schematic top view of the second transistor T2 according to an embodiment of the present disclosure. As shown in FIG. 7, unlike the second channel region, which is in the shape of Chinese character "一", shown in the previous embodiment, the second channel region shown in FIG. 7 is a channel region in a crescent shape, and the division pattern 1 is also in a crescent shape as a whole. Certainly, the shape of the second channel region in the embodiments of the present disclosure may also adopt any other shape, for example, a zigzag shape, a semicircular shape, and the like, which are not illustrated herein.

In some implementations, a ratio of a width of the division pattern 1 in the length direction of the second channel region to a width of the fourth electrode P4 in the length direction of the second channel region ranges from 1 to 2. In the embodiment of the present disclosure, in a case where the ratio of the width of the division pattern 1 in the length direction of the second channel region to the width of the fourth electrode P4 in the length direction of the second channel region is less than 1, the width of the division pattern is too small, and is difficult to be achieved by the current exposure process; in a case where the ratio of the width of the division pattern 1 in the length direction of the second channel region to the width of the fourth electrode P4 in the length direction of the second channel region is greater than 2, the width of the division pattern is too wide, so that it is difficult to ensure that the length L2' of each channel sub-region after division is within a preset range (for example, from $\frac{1}{2}\times L1$ to $3/2\times L1$).

Alternatively, the division pattern 1 may have a width ranging from 2.5 μm to 3.5 μm in the length direction of the second channel region.

With continued reference to FIGS. 2 and 4A, in some implementations, the first transistor T1 and the third transistor T3 are arranged along the second direction Y; and the first transistor T1 and the second transistor T2 are arranged along the first direction X.

In some implementations, the first electrode P1 and the second electrode P2 both extend along the first direction X, and the first electrode P1 and the second electrode P2 are arranged along the second direction Y; the fifth electrode P5 and the sixth electrode P6 both extend along the first direction X, and the fifth electrode P5 and the sixth electrode P6 are arranged along the second direction Y; the first electrode P1 and the fifth electrode P5 are the same. In the embodiment of the present disclosure, with above arrangement and the first electrode P1 and the fifth electrode P5 being the same, the overall occupied space of the first transistor T1, the second transistor T2 and the third transistor T3 can be effectively reduced, which is beneficial to increasing an aperture ratio of the pixel.

Referring again to FIG. 3A, in some implementations, the first active pattern 11 and the third active pattern 31 are connected as an unitary structure. Referring again to FIG. 3B, in some implementations, the first active pattern 11 is spaced apart from the third active pattern 31. That is, in a case where the first electrode P1 and the fifth electrode P5 are the same, both the first active pattern 11 and the third active pattern 31 may be connected as an unitary structure or may be provided at intervals.

Figure 8:
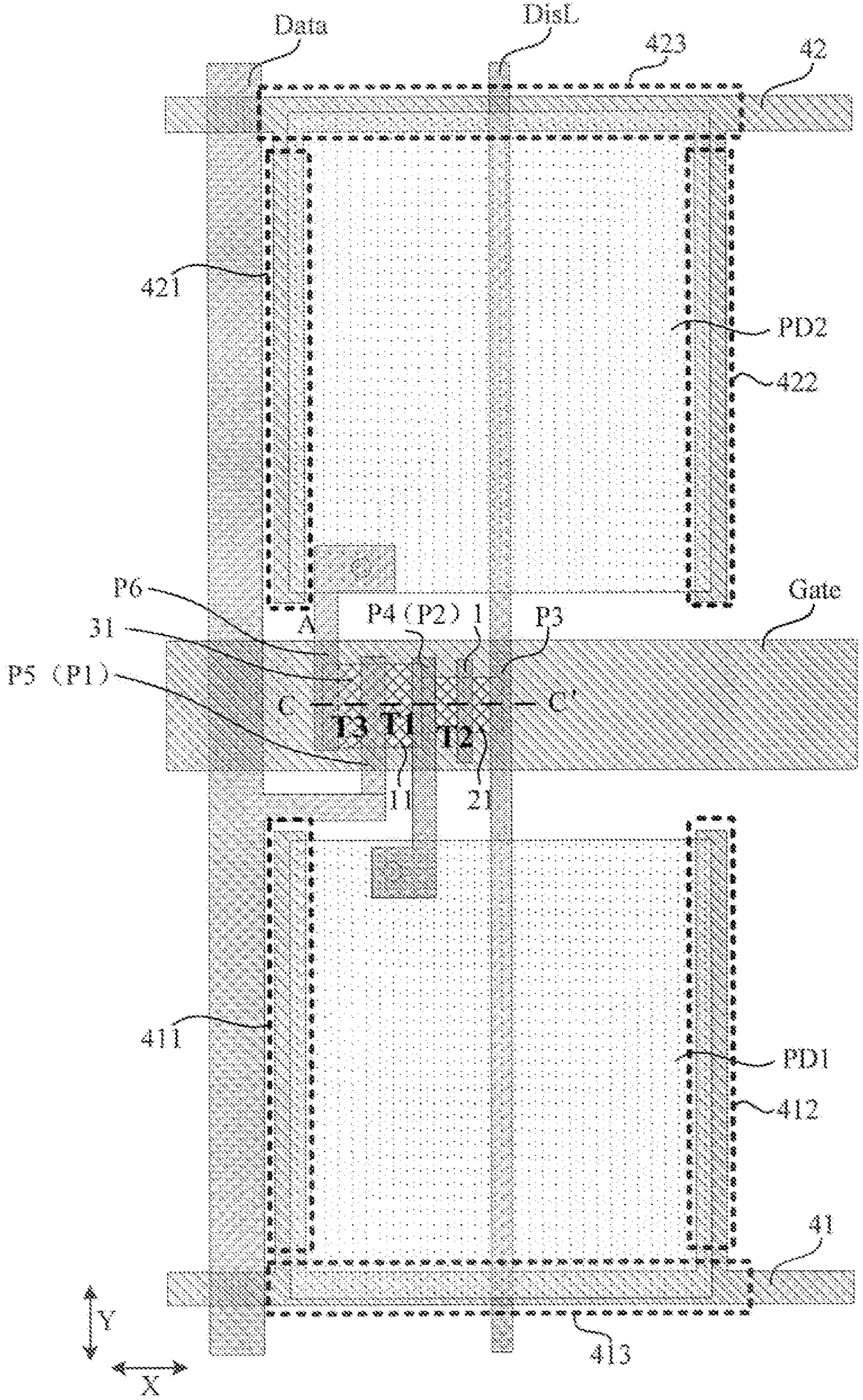
FIG. 8 is a schematic top view of a pixel unit according to an embodiment of the present disclosure.
Figure 9:
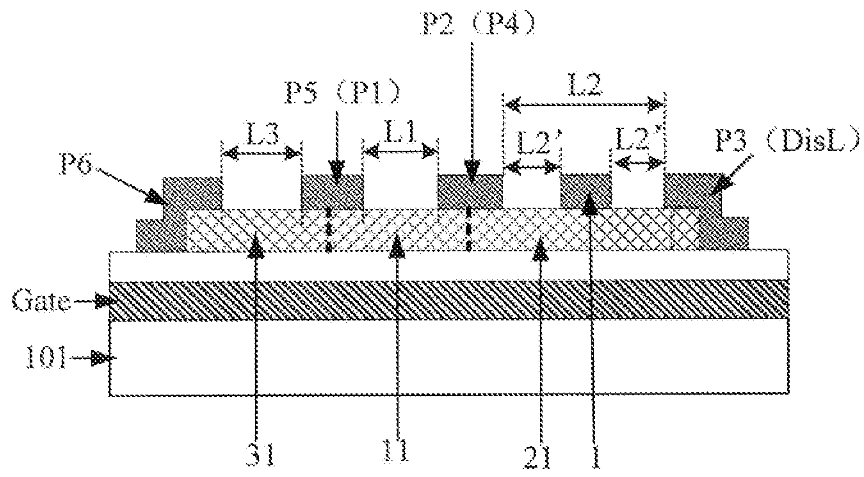
FIG. 9 is a schematic cross-sectional view of a structure of FIG. 8 taken along a line C-C'.

FIG. 8 is a schematic top view of a pixel unit according to an embodiment of the disclosure. FIG. 9 is a schematic cross-sectional view of a structure of FIG. 8 taken along a line C-C'. As shown in FIGS. 8 and 9, unlike the case where the first transistor T1 and the third transistor T3 are arranged along the second direction Y and the first transistor T1 and the second transistor T2 are arranged along the first direction X in the previous embodiment, FIG. 8 shows a case where all of the first transistor T1, the third transistor T3, and the second transistor T2 are arranged along the first direction X.

In some implementations, the first electrode P1 and the second electrode P2 both extend along the second direction Y, and the first electrode P1 and the second electrode P2 are arranged along the first direction X; the fifth electrode P5 and the sixth electrode P6 both extend along the second direction Y, and the fifth electrode P5 and the sixth electrode P6 are arranged along the first direction X; and the first electrode P1 and the fifth electrode P5 are the same electrode.

In some implementations, the third electrode P3, the fourth electrode P4 and the division pattern 1 all extend along the second direction Y, and the third electrode P3, the division pattern 1 and the fourth electrode P4 are arranged along the first direction X; and the second electrode P2 and the fourth electrode P4 are the same electrode.

In the embodiment of the present disclosure, with the above arrangement and design where the first electrode P1 and the fifth electrode P5 are the same electrode, and the second electrode P2 and the fourth electrode P4 are the same electrode, an overall occupied space of the first transistor T1, the second transistor and the third transistor T3 can be effectively reduced, which is beneficial to increasing the aperture ratio of the pixel.

In some implementations, the first active pattern 11, the second active pattern 21, and the third active pattern 31 are connected as an unitary structure.

Certainly, those skilled in the art should understand that the first transistor T1, the second transistor T2, and the third transistor T3 in the embodiments of the present disclosure may also be arranged in other ways, which are not limited in the present disclosure.

The pixel unit in the embodiment of the present disclosure is a multi-domain (for example, 8-domain) pixel unit, and the shape of the pixel electrode may be designed accordingly as desired. As an example, referring to FIGS. 2, 4A and 8, the pixel unit is an 8-domain pixel unit, and the shapes of the first pixel electrode PD1 and the second pixel electrode PD2 both may be rectangular.

Figure 10:
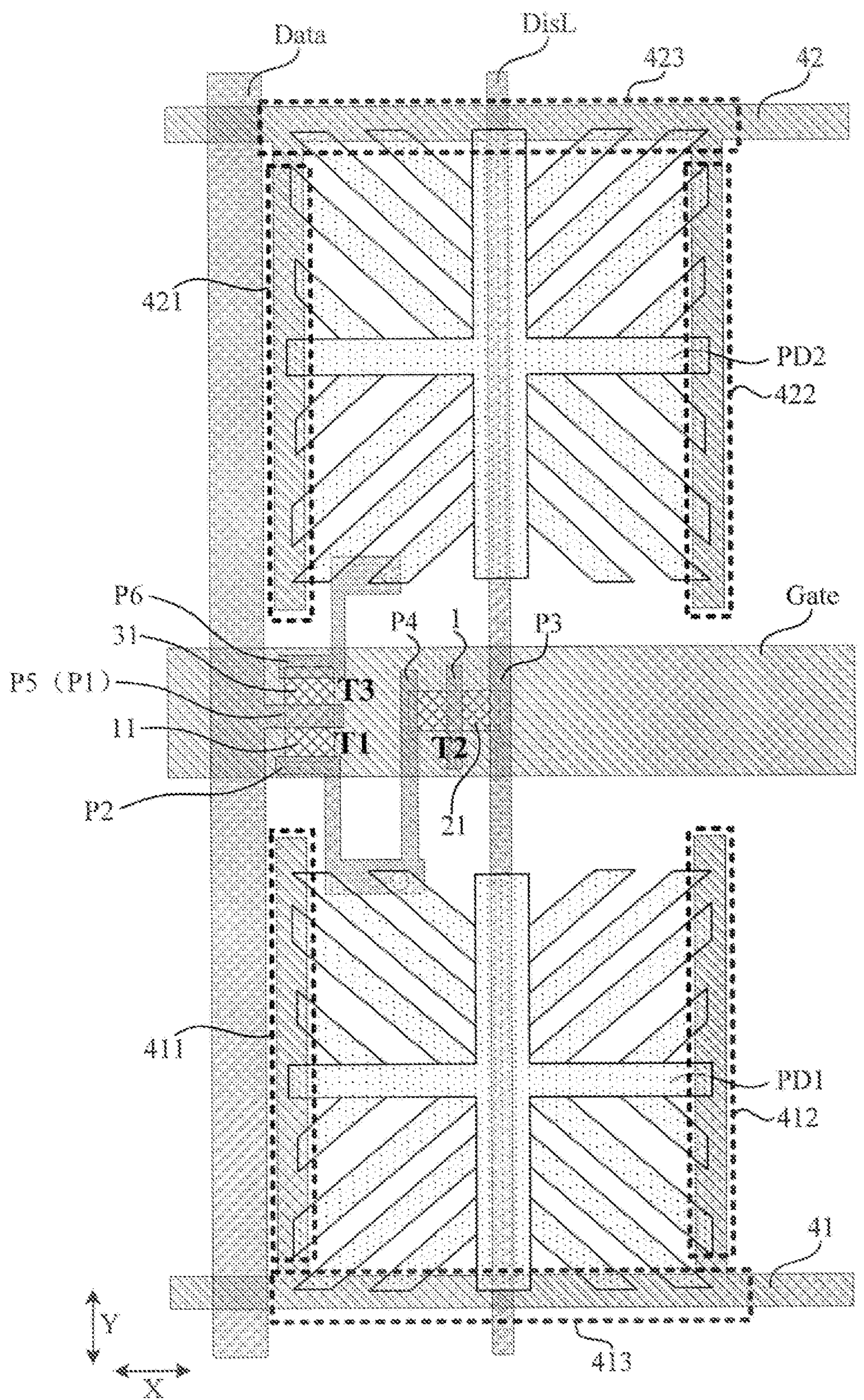
FIG. 10 is a schematic top view of a pixel unit according to an embodiment of the present disclosure.

FIG. 10 is a schematic top view of a pixel unit according to an embodiment of the present disclosure. As another example, as shown in FIG. 10, the pixel unit is an 8-domain pixel unit, and the first pixel electrode PD1 and the second pixel electrode PD2 are both of a structure in a shape of Chinese character "米". Specifically, the structure in the shape of Chinese character "米" includes: a first main part extending along the first direction X and a second main part extending along the second direction Y, the first main part and the second main part are intersected to define four zones, a plurality of branch parts which are parallel and arranged at intervals are arranged in each zone, and an end of each branch part is connected with the first main part or the second main part.

Certainly, the first pixel electrode PD1 and the second pixel electrode PD2 may also be in other shapes in the embodiment of the present disclosure, which are not described here by way of examples.

In the embodiment of the present disclosure, the pixel unit performs a multi-domain display, and generally, a longitudinal dark stripe exists at central positions of the first pixel electrode and the second pixel electrode, and thus an area where a connection line connecting the central positions of the first pixel electrode and the second pixel electrode is located is generally shielded by using a black matrix; therefore, in order to ensure the aperture ratio of the pixel and a balance of display proportions for multiple domains (such as 4 domains), the discharging line may be provided in the area where the connection line connecting the central positions of the first pixel electrode and the second pixel electrode is located.

It should be noted that, the specific structure of the transistor is not limited in the technical solution of the present disclosure, as long as it ensures that the source and drain of the transistor are located on the side of the active pattern away from the first base substrate.

Referring to FIGS. 2, 4A, 8 and 10 again, in some implementations, the first pixel sub-unit further includes a first plate pattern 41, the second pixel sub-unit further includes a second plate pattern 42, the first plate pattern 41 and an edge portion of the first pixel electrode PD1 may form a first storage capacitor Cst1 to improve a voltage maintaining capability of the first pixel electrode PD1, and the second plate pattern 42 and an edge portion of the second pixel electrode PD2 may form a second storage capacitor Cst2 to improve a voltage maintaining capability of the second pixel electrode PD2.

In some implementations, the first plate pattern 41 and the second plate pattern 42 are provided in the same layer as the gate lines Gate. That is, the first plate pattern 41 and the second plate pattern 42 may be located in the first conductive layer.

In some implementations, the first plate pattern 41 and the second plate pattern 42 may be applied with a common voltage Vcom thereon.

In some implementations, the first plate pattern 41 (the second plate pattern 42) may include at least one of a portion 411 (421) located on a side of the first pixel electrode PD1 (the second pixel electrode PD2) close to the data line Data corresponding thereto, a portion 412 (422) located on a side of the first pixel electrode PD1 (the second pixel electrode PD2) away from the data line Data corresponding thereto, a portion (not shown) located on a side of the first pixel electrode PD1 (the second pixel electrode PD2) close to the gate line Gate corresponding thereto, and a portion 413 (423) located on a side of the first pixel electrode PD1 (the second pixel electrode PD2) away from the gate line Gate corresponding thereto.

In some implementations, the portions (for example, the portions 411, 412, 421 and 422) of the first plate pattern 41 (the second plate pattern 42) are provided on the side of the first pixel electrode PD1 (the second pixel electrode PD2) close to or away from the data line Data corresponding thereto, so that a coupling effect of a voltage applied in the data line on a voltage applied in the pixel electrode can be effectively reduced.

The portions (for example, the portions 413 and the portions 423 in the figure) of the first plate pattern 41 (the second plate pattern 42) being provided on the side of the first pixel electrode PD1 (the second pixel electrode PD2) close to or away from the gate line Gate corresponding thereto, is beneficial to improving the aperture ratio of the pixel.

In some implementations, an orthographic projection of the portion 411 (421) of the first plate pattern 41 (the second plate pattern 42) located on the side of the first pixel electrode PD1 (the second pixel electrode PD2) close to the data line Data corresponding thereto on the first base substrate 101 overlaps with an orthographic projection of an edge of the first pixel electrode PD1 (the second pixel electrode PD2) close to the side of the data line Data corresponding thereto on the first base substrate 101.

An orthographic projection of the portion 412 (422) of the first plate pattern 41 (the second plate pattern 42) located on the side of the first pixel electrode PD1 (the second pixel electrode PD2) away from the data line Data corresponding thereto on the first base substrate 101 overlaps with an orthographic projection of an edge of the first pixel electrode PD1 (the second pixel electrode PD2) away from the data line Data corresponding thereto on the first base substrate 101.

An orthographic projection of the portion (not shown) of the first pixel electrode PD1 (the second pixel electrode PD2) located on the side of the first plate pattern 41 (the second plate pattern 42) close to the gate line Gate corresponding thereto on the first base substrate 101 overlaps with an orthographic projection of an edge of the first pixel electrode PD1 (the second pixel electrode PD2) close to the gate line Gate corresponding thereto on the first base substrate 101.

An orthographic projection of the portion 413 (423) of the first pixel electrode PD1 (the second pixel electrode PD2) located on the side of the first plate pattern 41 (the second plate pattern 42) away from the gate line Gate corresponding thereto on the first base substrate 101 overlaps with an orthographic projection of an edge of the first pixel electrode PD1 (the second pixel electrode PD2) away from the gate line Gate corresponding thereto on the first base substrate 101.

It should be noted that the first plate pattern 41 (the second plate pattern 42) is only exemplarily drawn to include three portions, that is, the portion 411 (421) located on the side of the first pixel electrode PD1 (the second pixel electrode PD2) close to the data line Data corresponding thereto, the portion 412 (422) located on the side of the first pixel electrode PD1 (the second pixel electrode PD2) away from the data line Data corresponding thereto, and the portion 413 (423) located on the side of the first pixel electrode PD1 (the second pixel electrode PD2) away from the gate line Gate corresponding thereto. In this case, the first plate pattern 41 (the second plate pattern 42) can form storage capacitors together with three edges of the first pixel electrode PD1 (the second pixel electrode PD2), but this case only serves as an example. Certainly, in the embodiment of the present disclosure, the first plate pattern 41 (the second plate pattern 42) may also be provided in a ring shape along the edges of the first pixel electrode PD1 (the second pixel electrode PD2) corresponding thereto. Other various cases of the first plate pattern 41 and the second plate pattern 42 will not be described here by way of examples.

Figure 11:
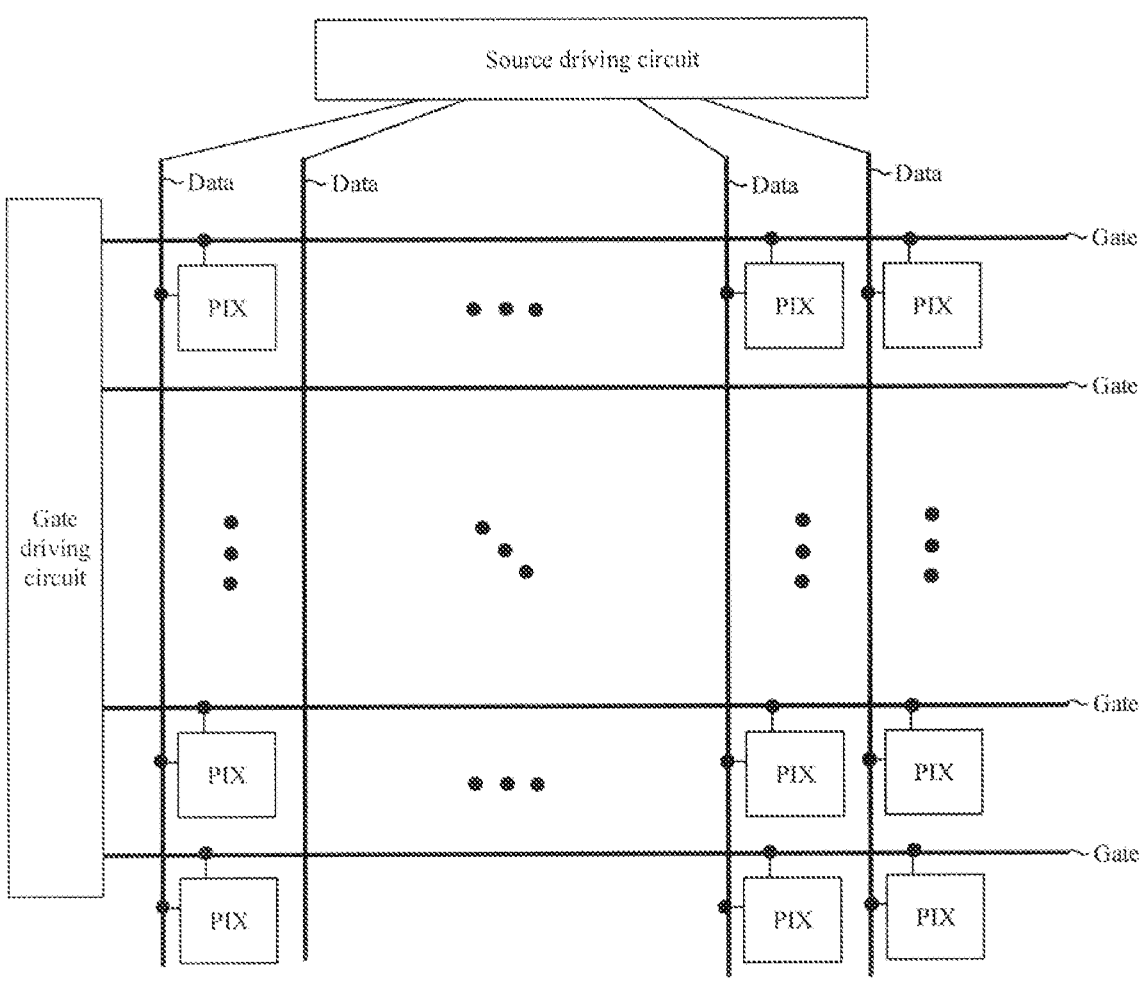
FIG. 11 is a schematic structural diagram of a display panel according to an embodiment of the present disclosure.
Figure 12:
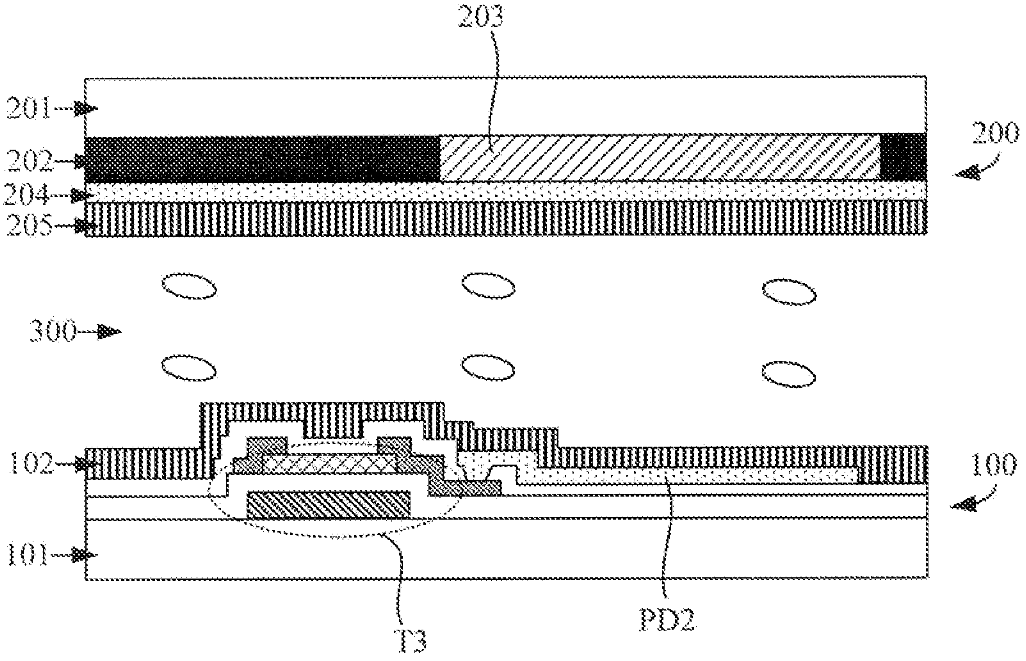
FIG. 12 is a schematic cross-sectional view of a partial area of a display panel according to an embodiment of the present disclosure.

Based on the same increative concept, an embodiment of the present disclosure further provides a display panel. FIG. 11 is a schematic structural diagram of a display panel according to an embodiment of the present disclosure. FIG. 12 is a schematic cross-sectional view of a partial area of the display panel according to an embodiment of the present disclosure. As shown in FIGS. 11 and 12, the display panel includes: an array substrate 100 and an opposite substrate 200 arranged opposite to the array substrate 100, where a liquid crystal layer 300 is arranged between the array substrate 100 and the opposite substrate 200, and the array substrate 100 includes a plurality of pixel units PIX. The array substrate 100 in the embodiment of the present disclosure may adopt the array substrate 100 in the previous embodiments.

The opposite substrate 200 in the embodiment of the present disclosure specifically may be a color filter substrate 200. The array substrate 100 may include the first conductive layer (specifically, the gate lines Gate, the gate electrodes of the transistors, the first plate pattern 41, and the second plate pattern 42), the semiconductor layer (specifically, the first active pattern 11, the second active pattern 21 and the third active pattern 31), the second conductive layer (specifically, the sources and drains of the transistors, the division patterns 1, the data lines Data, and the discharging lines DisL), and the pixel electrode layer (specifically, the first pixel electrode PD1 and the second pixel electrode PD2) in the foregoing embodiments, which is not described herein again, and for details, reference may be made to the foregoing embodiments. The color filter substrate 200 may include a second base substrate 201, a color filter layer, and a common electrode 204 located on a side of the color filter layer away from the second base substrate. The color filter layer may include color filters 203 (also referred to as color filter patterns) and a black matrix 202, each pixel unit on the array substrate 100 corresponds to one color block 203, and the black matrix 202 is located between adjacent color filters 203. A first liquid crystal capacitor may be formed between the first pixel electrode PD1 and the common electrode 204, and a second liquid crystal capacitor may be formed between the second pixel electrode PD2 and the common electrode 204.

Figure 13:
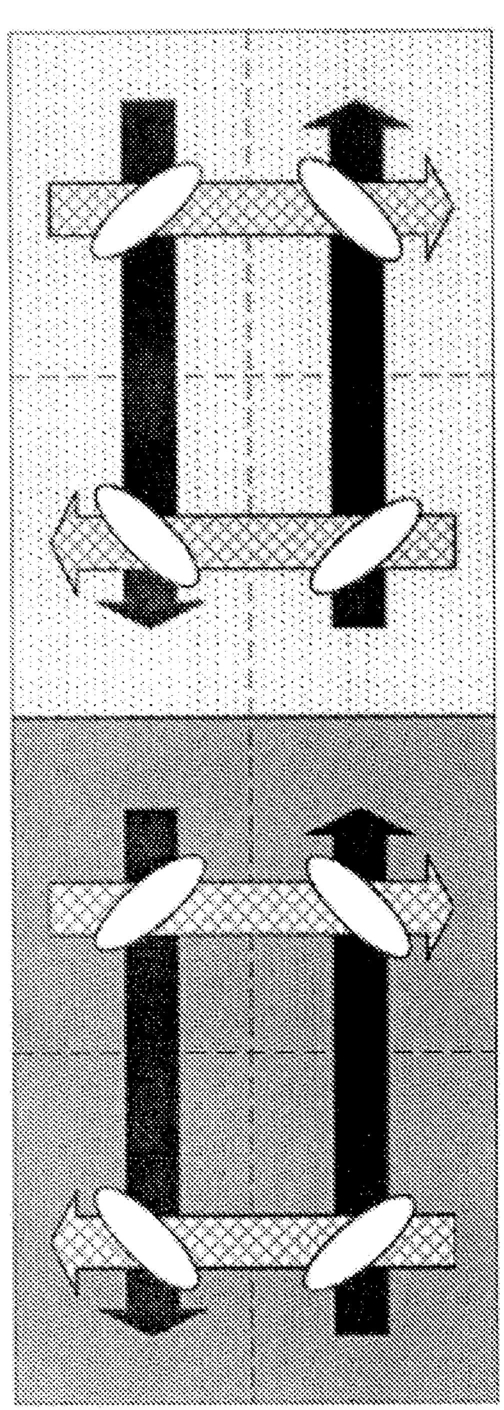
FIG. 13 is a schematic diagram illustrating alignment results of an array substrate and an opposite substrate corresponding to a pixel unit according to an embodiment of the present disclosure.
Figure 13:
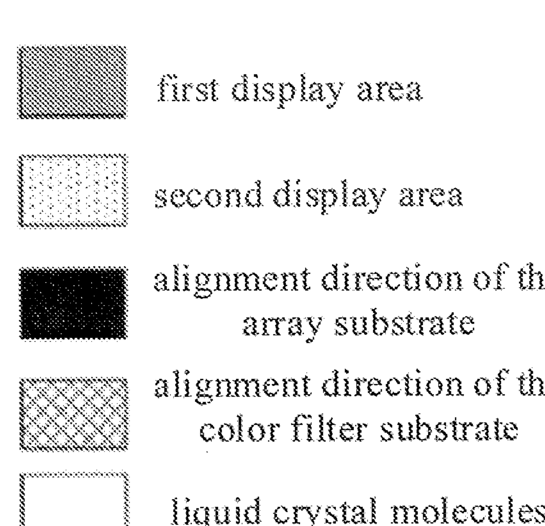

In addition, alignment films 102 and 205 are respectively provided on a side of the array substrate 100 close to the color filter substrate 200 and a side of the color filter substrate 200 close to the array substrate 100. FIG. 13 is a schematic diagram illustrating alignment results of the array substrate 100 and the color filter substrate 200 corresponding to a pixel unit in the embodiment of the present disclosure. As shown in FIG. 13, FIG. 13 illustrates the alignment of the alignment films formed on the array substrate 100 and the color filter substrate 200 by using ultraviolet induced multi-domain vertical alignment technique (UV2A) in a case where the pixel unit is an 8-domain pixel unit.

During the array substrate 100 being aligned, a flexible film layer may be formed on a surface of the array substrate 100 and is to be aligned. During the color filter substrate 200 being aligned, a flexible film layer may be formed on a surface of the color filter substrate 200 and is to be aligned. The flexible film formed on the array substrate 100 and the flexible film formed on the color filter substrate 200 both may be Polyimide (PI).

For the convenience of description, an area corresponding to the first pixel electrode PD1 is referred to as a first display area, and an area corresponding to the second pixel electrode PD2 is referred to as a second display area. In some implementations, alignment directions corresponding to the first display area and the second display area on the array substrate 100 are the same, and alignment directions corresponding to the first display area and the second display area on the color film substrate 200 are the same; after the array substrate 100 and the color filter substrate 200 are aligned, the liquid crystal molecules in the first display area of the pixel unit have four kinds of deflection angles (the first display area has four domains), and the liquid crystal molecules in the second display area of the pixel unit also have four kinds of deflection angles (the second display area has four domains), so that the pixel unit is an eight-domain pixel unit.

The display panel provided by the embodiment of the present disclosure may further include a gate driving circuit and a source driving circuit. The gate driving circuit is connected with the gate lines in the display panel to provide gate scanning signals for the gate lines; the source driving circuit is connected to the data lines in the display panel to provide data voltages to the data lines.

Based on the same increative concept, an embodiment of the present disclosure further provides a display device, the display device includes the display panel provided in the above embodiments.

In some implementations, the display device further includes a power supply unit that supplies power to the display panel.

It should be noted that the display device may be any product or component having a display function, such as a liquid crystal display device, electronic paper, a mobile phone, a tablet computer, a television, a display, a notebook computer, a digital photo frame, or a navigator.

It will be understood that the above embodiments are merely exemplary embodiments adopted to illustrate the principles of the present disclosure, and the present disclosure is not limited thereto. It will be apparent to those skilled in the art that various modifications and improvements can be made without departing from the spirit and scope of the present disclosure, and such modifications and improvements are also considered to be within the scope of the present disclosure.

What is claimed is:

1. An array substrate, comprising: a first base substrate, wherein a plurality of gate lines, a plurality of data lines and a plurality of discharging lines are arranged on the first base substrate, the gate lines extend along a first direction, the data lines and the discharging lines extend along a second direction, the gate lines and the data lines define a plurality of pixel units, and at least one of the pixel units includes a first pixel sub-unit, the first pixel sub-unit comprises a first transistor, a second transistor, and a first pixel electrode;

the first transistor comprises a first gate electrode, a first active pattern, a first electrode and a second electrode, wherein the first gate electrode is connected with one of the gate lines corresponding thereto, the first electrode is connected with one of the data lines corresponding thereto, and the second electrode is connected with the first pixel electrode;

the second transistor comprises a second gate electrode, a second active pattern, a third electrode and a fourth electrode, wherein the second gate electrode is connected with the one of the gate lines, the third electrode is connected with one of the discharging lines corresponding thereto, the fourth electrode is connected with the first pixel electrode, and the second active pattern comprises a second channel region located between the third electrode and the fourth electrode; and at least one division pattern is arranged between the third electrode and the fourth electrode, and an orthographic projection of the division pattern on the first base substrate is partially overlapped with an orthographic projection of the second channel region on the first base substrate.

2. The array substrate of claim 1, wherein the division pattern comprises a first portion and a second portion connected to each other, an orthographic projection of the first portion on the first base substrate is located in a region where an orthographic projection of the second channel region on the first base substrate is located, and an orthographic projection of the second portion on the first base substrate does not overlap with the orthographic projection of the second channel region on the first base substrate.

3. The array substrate of claim 1, wherein the first active pattern comprises a first channel region between the first electrode and the second electrode, the first channel region having a length of L1; and a distance, in a length direction of the second channel region, between any two of the third electrode, the fourth electrode, and the division pattern adjacent to each other in the length direction of the second channel region ranges from $\frac{1}{2}\times L1$ to $3/2\times L1$.

4. The array substrate of claim 1, wherein a ratio of a dimension of a width of the division pattern in a length direction of the second channel region to a dimension of a width of the fourth electrode in the length direction of the second channel region ranges from 1 to 2.

5. The array substrate of claim 4, wherein the dimension of the width of the division pattern in the length direction of the second channel region ranges from 2.5 μm to 3.5 μm.

6. The array substrate of claim 1, wherein a material of the division pattern comprises a conductive material;

the division pattern extends in a width direction of the second channel region; and a shape of an orthographic projection of the division pattern on the first base substrate is a rectangle, an ellipse, or an octagon.

7. The array substrate of claim 1, wherein the division pattern comprises at least two division sub-patterns arranged at intervals along a width direction of the second channel region, wherein the interval between any two adjacent division sub-patterns is less than or equal to 1.5 μm.

8. The array substrate of claim 1, wherein two or more division patterns are provided, a connection pattern is provided between two adjacent division patterns, two ends of the connection pattern connect the two adjacent division patterns respectively, and an orthographic projection of the connection pattern on the first base substrate does not overlap the orthographic projection of the second channel region on the first base substrate.

9. The array substrate of claim 1, wherein an orthographic projection of the second active pattern on the first base substrate covers an orthographic projection of the division pattern on the first base substrate, and a distance between an outer edge of the division pattern and an outer edge, which is on the same side as the outer edge of the division pattern, of the second active pattern ranges from 1 μm to 2 μm.

10. The array substrate of claim 1, wherein the first active pattern comprises a first channel region between the first electrode and the second electrode, the first channel region having a length of L1 and a width of W1;

the second channel region has a length of L2 and a width of W2; and

W1, L1, W2 and L2 satisfy following conditions: W2/L2 is not greater than W1/L1, and L2 is not less than 3/2×L1.

11. The array substrate of claim 1, wherein the division pattern is provided in the same layer as the third electrode and the fourth electrode;

the third electrode, the fourth electrode and the division pattern each extend along the second direction, and the third electrode, the division pattern and the fourth electrode are arranged along the first direction.

12. The array substrate of claim 11, wherein the third electrode and the discharging line are of a unitary structure.

13. The array substrate of claim 1, wherein the pixel unit further comprises a second pixel sub-unit, the second pixel sub-unit comprises a third transistor and a second pixel electrode;

the third transistor comprises a third gate, a third active pattern, a fifth electrode and a sixth electrode, wherein the third gate is connected with one of the gate lines, the fifth electrode is connected with one of the data lines, and the sixth electrode is connected with the second pixel electrode;

the third active pattern comprises a third channel region between the fifth electrode and the sixth electrode, the third channel region has a length of L3 and a width of W3;

the first active pattern comprises a first channel region between the first electrode and the second electrode, the first channel region has a length of L1 and a width of W1;

wherein, W3=W1, and L3=L1.

14. The array substrate of claim 13, wherein the first pixel electrode and the second pixel electrode are arranged along the second direction, and the gate line, the first transistor, the second transistor and the third transistor are all located between the first pixel electrode and the second pixel electrode;

the first transistor and the second transistor are both located between the data line and the discharging line, and wherein the first transistor and the third transistor are arranged along the second direction; and the first transistor and the second transistor are arranged along the first direction.

15. The array substrate of claim 14, wherein the first electrode and the second electrode each extend along the first direction, and first electrode and the second electrode are arranged along the second direction;

the fifth electrode and the sixth electrode each extend along the first direction, and the fifth electrode and the sixth electrode are arranged along the second direction; and the first electrode and the fifth electrode are the same.

16. The array substrate of claim 15, wherein the first active pattern and the third active pattern are connected as a unitary structure;

or, the first active pattern and the third active pattern are arranged at intervals.

17. The array substrate of claim 13, wherein the first transistor, the third transistor, and the second transistor are all arranged along the first direction; and wherein the first electrode and the second electrode each extend along the second direction, and the first electrode a the second electrode are arranged along the first direction;

the fifth electrode and sixth electrode each extend along the second direction, and the fifth electrode and the sixth electrode are arranged along the first direction; and the first electrode and the fifth electrode are the same;

the third electrode, the fourth electrode and the division pattem all extend along the second direction, and the third electrode, the division pattern and the fourth electrode are arranged along the first direction; and the second electrode and the fourth electrode are the same.

18. The array substrate of claim 17, wherein the first active pattern, the second active pattern, and the third active pattern are connected as a unitary structure, and wherein the first pixel electrode and the second pixel electrode are both rectangular electrodes;

or, the first pixel electrode and the second pixel electrode are both in a shape of a Chinese character '米'.

19. A display panel, comprising: an array substrate, and an opposite substrate arranged opposite to the array substrate, wherein the array substrate adopts the array substrate of claim 1.

20. A display device, comprising: the display panel of claim 19.

* * * * *